(12) United States Patent
Hiramoto et al.

(10) Patent No.: US 8,618,870 B2
(45) Date of Patent: Dec. 31, 2013

(54) VOLTAGE CHARACTERISTIC REGULATING METHOD OF LATCH CIRCUIT, VOLTAGE CHARACTERISTIC REGULATING METHOD OF SEMICONDUCTOR DEVICE, AND VOLTAGE CHARACTERISTIC REGULATOR OF LATCH CIRCUIT

(75) Inventors: Toshiro Hiramoto, Tokyo (JP); Takayasu Sakurai, Tokyo (JP); Makoto Suzuki, Tokyo (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 0 days.

(21) Appl. No.: 13/377,009

(22) PCT Filed: Jun. 11, 2010

(86) PCT No.: PCT/JP2010/059908
§ 371 (c)(1),
(2), (4) Date: Mar. 27, 2012

(87) PCT Pub. No.: WO2010/143707
PCT Pub. Date: Dec. 16, 2010

(65) Prior Publication Data
US 2012/0182064 A1 Jul. 19, 2012

(30) Foreign Application Priority Data
Jun. 12, 2009 (JP) .................................. 2009-141510

(51) Int. Cl.
G05F 1/10 (2006.01)
(52) U.S. Cl.
USPC ...................................... 327/544; 365/189.09

(58) Field of Classification Search
None
See application file for complete search history.

(56) References Cited

U.S. PATENT DOCUMENTS

| 5,757,696 | A | 5/1998 | Matsuo et al. |
| 5,956,269 | A * | 9/1999 | Ouyang et al. ............ 365/185.08 |
| 6,269,027 | B1 | 7/2001 | Hurst, Jr. et al. |
| 6,285,213 | B1 * | 9/2001 | Makino ............................ 326/81 |
| 6,556,071 | B2 * | 4/2003 | Notani et al. .................. 327/544 |

(Continued)

FOREIGN PATENT DOCUMENTS

| JE | A-2008-53269 | 3/2008 |
| JP | A-6-76582 | 3/1994 |

(Continued)

OTHER PUBLICATIONS

International Search Report dated Sep. 28, 2010 in International Application No. PCT/JP2010/059908 (with translation).

(Continued)

*Primary Examiner* — Thomas J Hiltunen
(74) *Attorney, Agent, or Firm* — Oliff & Berridge, PLC

(57) ABSTRACT

The voltage Vdd is set to be lower than in the normal operation (step S100), then voltage is applied to each of the power-supply voltage applied node Vdd, the ground voltage applied node Vss, the semiconductor substrate and the well so that relative high voltage between the gate of turn-on transistor and the semiconductor substrate or the gate of turn-on transistor and well (steps S110 and S120). This process accomplishes rising of the threshold voltage of the transistor that is turned on, the reduction of the variation in the threshold voltage between a plurality of the transistors of the memory cell including latch circuit, and the improvement of the voltage characteristic of the memory cell.

15 Claims, 14 Drawing Sheets

(56) References Cited

U.S. PATENT DOCUMENTS

| | | | |
|---|---|---|---|
| 6,795,332 B2 * | 9/2004 | Yamaoka et al. | 365/154 |
| 6,862,227 B2 * | 3/2005 | Yamaoka et al. | 365/189.09 |
| 7,027,346 B2 * | 4/2006 | Houston et al. | 365/229 |
| 7,486,544 B2 * | 2/2009 | Mori et al. | 365/156 |
| 7,626,855 B2 * | 12/2009 | Kodama et al. | 365/156 |
| 7,697,356 B2 * | 4/2010 | Akiyama | 365/201 |
| 7,969,780 B2 * | 6/2011 | Ogura et al. | 365/185.08 |
| 8,270,230 B2 * | 9/2012 | Yamaoka et al. | 365/189.07 |
| 2001/0038552 A1 * | 11/2001 | Ishimaru | 365/181 |
| 2004/0105301 A1 | 6/2004 | Toyoda et al. | |
| 2004/0145953 A1 * | 7/2004 | Kawagoe et al. | 365/189.09 |
| 2005/0213371 A1 | 9/2005 | Kimura | |
| 2008/0049515 A1 | 2/2008 | Kodama et al. | |

FOREIGN PATENT DOCUMENTS

| | | |
|---|---|---|
| JP | A-7-272490 | 10/1995 |
| JP | A-2002-511631 | 4/2002 |
| JP | A-2005-228371 | 8/2005 |
| JP | A-2005-276315 | 10/2005 |
| WO | WO 03/105156 A1 | 12/2003 |

OTHER PUBLICATIONS

Jan. 17, 2012 International Preliminary Report on Patentability issued in International Patent Application No. PCT/JP2010/059908.

* cited by examiner

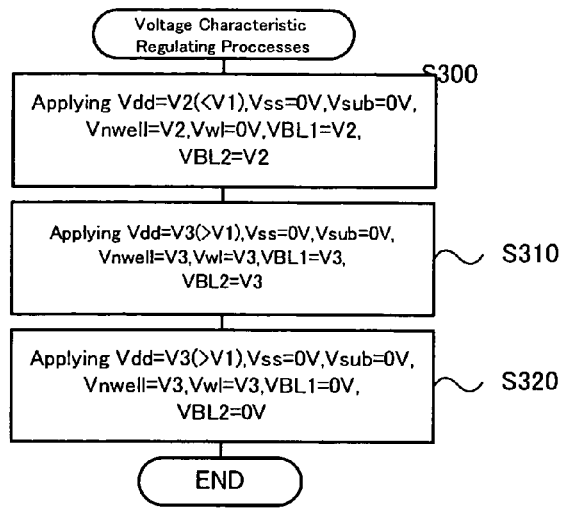
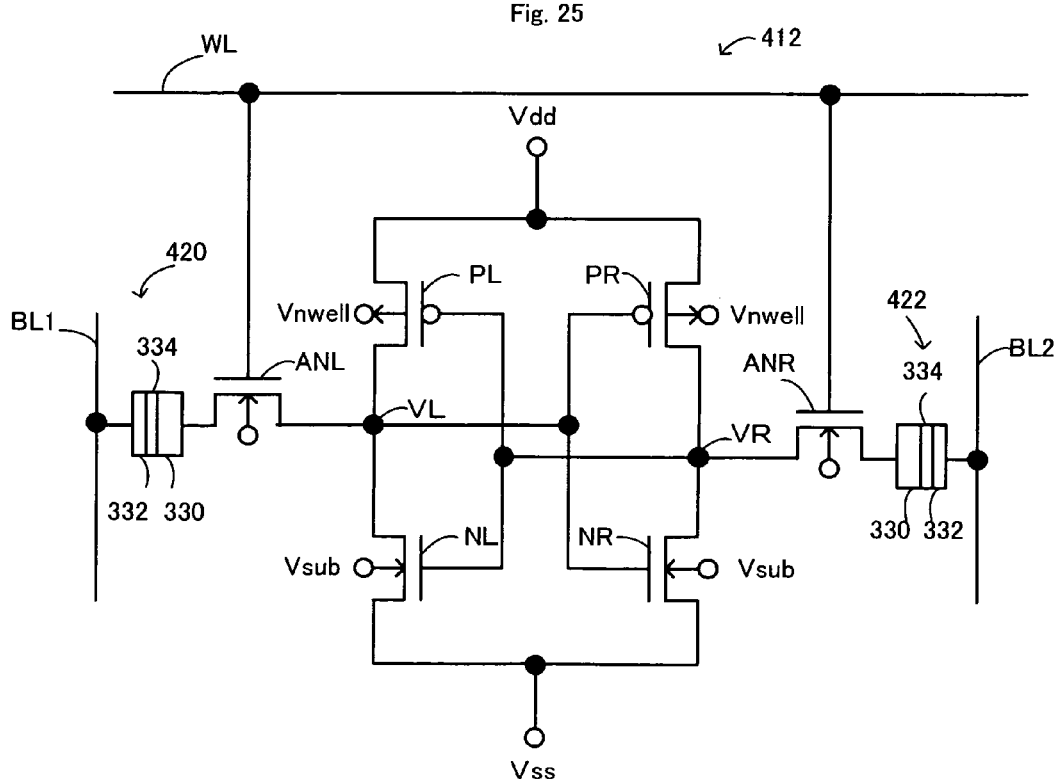

VOLTAGE CHARACTERISTIC REGULATING METHOD OF LATCH CIRCUIT, VOLTAGE CHARACTERISTIC REGULATING METHOD OF SEMICONDUCTOR DEVICE, AND VOLTAGE CHARACTERISTIC REGULATOR OF LATCH CIRCUIT

TECHNICAL FIELD

The present invention relates to a voltage characteristic regulating method of latch circuit, a voltage characteristic regulating method of semiconductor device, and a voltage characteristic regulator of latch circuit, for details, a voltage characteristic regulating method, a voltage characteristic regulating method and a voltage characteristic regulator of latch circuit regulating voltage characteristic of the latch circuit comprising a plurality of gate type transistors that are formed in a semiconductor substrate.

BACKGROUND ART

A proposed method for regulating threshold voltage of gate type transistor, or MOS (Metal-Oxide-Semiconductor) transistor of a flash memory cell, that has a floating gate formed on a semiconductor substrate via a gate insulator film and a control gate formed on the floating gate via gate intervening insulator film includes adjusting threshold voltage of the MOS transistor by varying amount of electron accumulated in the floating gate (see, for example, Patent Document 1). When the threshold voltage of the MOS transistor configuring a flash memory is equal to or lower than preset lower limit, this proposed method adjusts the threshold voltage by applying, for the MOS transistor that the threshold voltage thereof is equal to or lower than the preset lower limit, voltage of 0V to the control gate connected with a word line, drive voltage to a drain connected with a bit line and voltage of 0V to a source to inject electrons to the floating gate. A latch circuit is known for a proposed circuit configured with a plurality of gate-type transistors.

PRIOR ART DOCUMENT

Patent Document 1: Japanese Patent Laid-Open Gazette No. 2005-228371

DISCLOSURE OF THE INVENTION

In the latch circuit configured with a plurality of gate type transistors, when there is variation in the threshold voltage among the gate type transistors, voltage characteristic of the latch circuit deteriorates. This causes the latch circuit to lose function of binary recording by bistable operation that is a feature of the latch circuit, and sometimes causes the latch circuit a malfunction. Applying above method to lower the variation in the threshold voltage is considered to be a method of improving the voltage characteristic of the latch circuit. In the above method, the threshold voltage of each of the gate type transistors is examined, the transistor that threshold voltage thereof decreases is identified, and the threshold voltage of the identified transistor is need to be adjusted. It takes relatively long time to adjust the threshold voltage of a lot of gate type transistors that the variation in the threshold voltage occurs therein. Adjusting the threshold voltage of the transistor by simpler method to improve the voltage characteristic is preferable.

In a voltage characteristic regulating method of latch circuit and voltage characteristic regulating method of semiconductor device, there would thus be a demand for improving the voltage characteristic by simpler method.

The present invention accomplishes at least part of the demand mentioned above and the other relevant demands by the following configurations applied to the voltage characteristic regulating method of latch circuit and the voltage characteristic regulating method of semiconductor device.

According to one aspect, the present invention is directed to a voltage characteristic regulating method of a latch circuit regulating voltage characteristic of the latch circuit. The latch circuit includes a plurality of gate type transistors that are formed in a semiconductor substrate. The voltage characteristic regulating method includes: applying voltage that is able to causes the latch circuit a malfunction to a voltage applied node that voltage is applied thereto in normal operation of the latch circuit; and then applying voltage that is able to nonvolatilely lower current driving force of the gate type transistor included in the latch circuit to the voltage applied node.

In the voltage characteristic regulating method of the latch circuit according to this aspect of the invention, the voltage applied node that voltage is applied thereto in normal operation of the latch circuit is applied voltage that is able to causes the latch circuit a malfunction, and then the voltage applied node is applied voltage that is able to nonvolatilely lower the current driving force of the gate type transistor included, in the latch circuit thereto. This accomplishes rising of the threshold voltage, the reduction of current, and decrease of the current driving force for the gate type transistor that turns on, or the transistor that has low threshold voltage, or for the transistor that has same threshold voltage as others and flow large current, or the transistor that has high current drive force. This accomplishes reduction of the variation among the gate type transistors. In this case, reduction of the variation among a plurality of the gate type transistors is accomplished just by adjusting voltage that is applied to the voltage applied node and voltage that is applied to the semiconductor substrate. This accomplishes improvement of the voltage characteristic by simpler method. In the above case, "nonvolatilely" means that the current driving force is almost maintained when applying voltage to the voltage applied node is stopped and then applying voltage to the voltage applied node is started again.

In one preferable application of the voltage characteristic regulating method of the latch circuit according to the above aspect of the invention, preset low voltage that is lower than power-supply voltage in the normal operation of the latch circuit is applied to a power-supply voltage applied node of the latch circuit that the power-supply voltage is applied thereto in normal operation of the latch circuit, and normal operation substrate voltage applied in the normal operation is applied to the semiconductor substrate. Then at least one of voltage applied to the power-supply voltage applied node and voltage applied to the semiconductor substrate is adjusted so that voltage difference between the power-supply voltage applied node and the semiconductor substrate is equal to or higher than the preset voltage difference that is larger than the voltage difference between the power-supply voltage applied node and the semiconductor substrate in the normal operation of the latch circuit. The preset low voltage that is lower than the power-supply voltage in the normal operation of the latch circuit is applied to the power-supply voltage applied node of the latch circuit that the power-supply voltage is applied thereto in normal operation of the latch circuit, and the normal operation substrate voltage applied in the normal operation is applied to the semiconductor substrate. This operation allows transistor that is included in a plurality of gate type transistors and has low threshold voltage to turn on. Then at least one of voltage applied to the power-supply voltage applied node and voltage applied to the semiconductor substrate is adjusted so that the voltage difference between the power-supply voltage applied node and the semiconductor substrate is equal to or higher than the preset voltage difference that is larger than the voltage difference between the power-supply voltage applied node and the semiconductor substrate in the normal operation of the latch circuit. This accomplishes rising of the threshold voltage and lowering current to lower the current driving force for the gate type transistor that turns on, or the transistor that has low threshold voltage, or for the transistor that has same threshold voltage as others and flow large current, or the transistor that has high current drive force. This accomplishes the reduction of the variation in the threshold voltage and the current among a plurality of the gate type transistors. In this case, the reduction of the variation among a plurality of the gate type transistors is accomplished just by adjusting voltage that is applied to the voltage applied node and voltage that is applied to the semiconductor substrate. This accomplishes the improvement of the voltage characteristic by simpler method.

In another preferable application of the voltage characteristic regulating method of the latch circuit according to the above aspect of the invention, the latch circuit includes a plurality of n-conductivity gate type transistor formed in the p-conductivity semiconductor substrate, and a plurality of p-conductivity gate type transistors formed in n-conductivity well region that is formed in the semiconductor substrate. The preset low voltage that is lower than the power-supply voltage in the normal operation of the latch circuit is applied to a power-supply voltage applied node, the normal operation substrate voltage is applied to the semiconductor substrate, and normal well voltage applied to the well region in the normal operation of the latch circuit is applied to the well region. Then preset high voltage that is higher than power-supply voltage in the normal operation of the latch circuit is applied to the power-supply voltage applied node of the latch circuit, the preset high voltage is applied to the well region and voltage that is lower than the normal operation substrate voltage is applied to the semiconductor substrate so that the voltage difference between the power-supply voltage applied node and the semiconductor substrate is equal to or higher than preset n-conductivity transistor voltage difference that is larger than the voltage difference between the power-supply voltage applied node and the semiconductor substrate in the normal operation of the latch circuit. This accomplishes the reduction of the variation among n-conductivity transistors and improvement of the voltage characteristic by simpler method.

In one preferable application of the voltage characteristic regulating method of the latch circuit according to the above aspect of the invention, the latch circuit includes a plurality of n-conductivity gate type transistor formed in the p-conductivity semiconductor substrate, and a plurality of p-conductivity gate type transistors formed in n-conductivity well region that is formed in the semiconductor substrate. The preset low voltage that is lower than the power-supply voltage in the normal operation of the latch circuit is applied to a power-supply voltage applied node, the normal operation substrate voltage is applied to the semiconductor substrate, and normal well voltage applied to the well region in the normal operation of the latch circuit is applied to the well region. Then preset high voltage that is higher than power-supply voltage in the normal operation of the latch circuit is applied to the power-supply voltage applied node of the latch circuit, the normal operation substrate voltage is applied to the semiconductor substrate and voltage that is higher than the normal operation well voltage is applied to the well region so that the voltage difference between the power-supply voltage applied node and the well region is equal to or higher than preset p-conductivity transistor voltage difference that is larger than the voltage difference between the power-supply voltage applied node and the well region in the normal operation of the latch circuit. This accomplishes the reduction of the variation among p-conductivity gate type transistors, and improvement of the voltage characteristic by simpler method.

According to another aspect, the present invention is directed to a voltage characteristic regulating method of a latch circuits regulating voltage characteristic of a plurality of the latch circuits. Each of the latch circuits includes a plurality of gate type transistors that are formed in a semiconductor substrate. The voltage characteristic regulating method includes: applying voltage that is able to causes the latch circuit a malfunction to voltage applied nodes of the plurality of the latch circuits, each of the voltage applied nodes being applied voltage thereto in normal operation of the latch circuit; and then applying voltage that is able to nonvolatilely lower current driving force of the gate type transistor included in the latch circuit to each of the voltage applied nodes of the latch circuits.

In the voltage characteristic regulating method of the latch circuits according to this aspect of the invention, voltage that is able to causes the latch circuit a malfunction is applied to voltage applied nodes of the plurality of the latch circuits. Each of the voltage applied nodes is applied voltage thereto in normal operation of the latch circuit. Then voltage that is able to nonvolatilely lower current driving force of the gate type transistor included in the latch circuit is applied to each of the voltage applied nodes of the latch circuits. This accomplishes rising of the threshold voltage, reduction of current, and reduction of the current driving force for the gate type transistor that turns on, or the transistor that has low threshold voltage, or for the transistor that has same threshold voltage as others and flow large current, or the transistor that has high current drive force. This accomplishes the reduction of the variation among the gate type transistors. In this case, the reduction of the variation among a plurality of the gate type transistors is accomplished just by adjusting voltage that is applied to the voltage applied node and voltage that is applied to the semiconductor substrate. This accomplishes the improvement of the voltage characteristic of the latch circuit by simpler method. In the above case, "nonvolatilely" means that the current driving force is almost maintained when applying voltage to the voltage applied node is stopped and then applying voltage to the voltage applied node is started again.

In one preferable application of the voltage characteristic regulating method of the latch circuit according to the above aspect of the invention, preset low voltage that is lower than power-supply voltage in the normal operation of the latch circuit is applied to each of power-supply voltage applied nodes of the latch circuits that the power-supply voltage is applied thereto in normal operation of the latch circuit, and normal operation substrate voltage applied in the normal operation is applied to the semiconductor substrate. Then at least one of voltage applied to each of the power-supply voltage applied nodes of the latch circuits and voltage applied to the semiconductor substrate is adjusted so that voltage difference between the power-supply voltage applied node and the semiconductor substrate is equal to or higher than the preset voltage difference that is larger than the voltage difference between the power-supply voltage applied node and the semiconductor substrate in the normal operation of the latch circuit. The preset low voltage that is lower than the power-supply voltage in the normal operation of the latch circuit is applied to each of the power-supply voltage applied nodes of the latch circuits that the power-supply voltage is applied thereto in the normal operation of the latch circuit, and the normal operation substrate voltage applied in the normal operation is applied to the semiconductor substrate. This operation allows transistor that is included in a plurality of gate type transistors of a plurality of the latch circuits and has low threshold voltage to turn on.

Then at least one of voltage applied to each of the power-supply voltage applied nodes of the latch circuits and voltage applied to the semiconductor substrate is adjusted so that voltage difference between the power-supply voltage applied node and the semiconductor substrate is equal to or higher than the preset voltage difference that is larger than the voltage difference between the power-supply voltage applied node and the semiconductor substrate in the normal operation of the latch circuit. This accomplishes rising of the threshold voltage, reduction of current, and reduction of the current driving force for the gate type transistor of the latch circuit that turns on, or the transistor that has low threshold voltage, or for the transistor that has same threshold voltage as others and flow large current, or the transistor that has high current drive force. This accomplishes the reduction of the variation among the gate type transistors of the latch circuit. In this case, the reduction of the variation among a plurality of the gate type transistors of the latch circuit is accomplished just by adjusting voltage that is applied to the voltage applied node and voltage that is applied to the semiconductor substrate. This accomplishes the improvement of the voltage characteristic of the latch circuit by simpler method.

In another preferable application of the voltage characteristic regulating method of the latch circuit according to the above aspect of the invention, the gate type transistor is allowed to have an insulating layer formed from insulating material having preset isolation performance between the semiconductor substrates and a gate. The gate type transistor is allowed to include a first insulating layer formed from first insulating material having first isolation performance and formed on the semiconductor substrate, a floating gate formed a first electrode material formed on the first insulating layer, a second insulating layer formed from second insulating material having second isolation performance and formed on the floating gate, a gate formed a second electrode material formed on the second insulating layer. The gate type transistor is allowed to include a first insulating layer formed from first insulating material having first isolation performance and formed on the semiconductor substrate, a second insulating layer formed from second insulating material and formed above the first insulating layer, a plurality of dot area formed from first material and placed between the first insulating layer and the second insulation layer, a gate formed a second electrode material formed on the second insulating layer. The gate type transistor is allowed to include a high dielectric layer formed from preset high dielectric material between the semiconductor substrate and a gate. The gate type transistor is allowed to include a first insulating layer and a stacked structure. A source or drain of the gate type transistor is connected with the stacked structure. The first insulating layer is formed from first insulating material having first isolation performance and formed between the semiconductor substrate and gate. The stacked structure includes a second insulating layer between a pinned layer and a fixed layer. The second insulating layer is formed from an insulating material having second isolation performance. The pinned layer is formed from first magnetic material so that direction of magnetization is fixed. The free layer is formed from second magnetic material so that direction of magnetization is able to vary. The gate type transistor is allowed to include an insulating layer formed from insulating material having preset isolation performance between the semiconductor substrates and a gate, a source and a drain formed from the first ferromagnetic material.

According to one aspect, the present invention is directed to a voltage characteristic regulating method of a semiconductor device, the semiconductor device includes: a first transistor, a second transistor, a third transistor, a fourth transistor, a first access transistor and a second access transistor. The first transistor is p-conductivity gate type transistor having a source connected with a power-supply voltage applied node that a power-supply voltage is applied thereto in the normal operation. The second transistor is n-conductivity gate type transistor having a drain connected with a drain of the first transistor, a gate connected with a gate of the first transistor, and a source connected with a ground voltage applied node that is applied a ground voltage thereto in the normal operation. The third transistor is p-conductivity gate type transistor having a source connected with the power-supply voltage applied node, a gate connected with a connecting node that is connected with the drain of the first transistor and the drain of the second transistor, and a drain connected with a connecting node that is connected with the gate of the first transistor and the gate of the second transistor. The fourth transistor is n-conductivity gate type transistor having a drain connected with the drain of the third transistor, a gate connected with the gate of the third transistor and a source connected with the ground voltage applied node. The first access transistor is n-conductivity gate type transistor having a gate connected with a word line that is applied control voltage thereto in the normal operation, electrically connecting a connecting node that is connected with the drain of the first transistor and the drain of the second transistor with a first bit line that outputs data in turning on, and electrically disconnecting the connecting node that is connected with the drain of the first transistor and the drain of the second transistor with the first bit line in turning off. The second access transistor is n-conductivity gate type transistor having a gate connected with the word line, electrically connecting a connecting node that is connected with the drain of the third transistor and the drain of the fourth transistor with the second bit line that outputs data and differs from the first bit line in turning on, and electrically disconnecting the connecting node that is connected with the drain of the third transistor and the drain of the fourth transistor with the second bit line in turning off. The first transistor, the second transistor, the third transistor, the fourth transistor, the first access transistor, and the second access transistor is formed a semiconductor substrate respectively. The voltage characteristic regulating method includes applying preset low voltage that is lower than power-supply voltage in the normal operation of the semiconductor device to a power-supply voltage applied node in normal operation of the semiconductor device, applying normal operation substrate voltage that is applied in the normal operation of the semiconductor device to the semiconductor substrate, then adjusting at least one of voltage applied to the power-supply voltage applied node and voltage applied to the semiconductor substrate so that voltage difference between the power-supply voltage applied node and the semiconductor substrate is equal to or higher than the preset voltage difference that is larger than the voltage difference between the power-supply voltage applied node and the semiconductor substrate in the normal operation of the semiconductor device.

In the voltage characteristic regulating method of the semiconductor device according to this aspect of the invention, the preset low voltage that is lower than power-supply voltage in the normal operation of the semiconductor device is applied to the power-supply voltage applied node in the normal operation of the semiconductor device, and normal operation substrate voltage that is applied in the normal operation of the semiconductor device is applied to the semiconductor substrate. This operation allows transistor that is included in a plurality of gate type transistors and has low threshold voltage to turn on. Then at least one of voltage applied to the power-supply voltage applied node and voltage applied to the semiconductor substrate is adjusted so that voltage difference between the power-supply voltage applied node and the semiconductor substrate is equal to or higher than the preset voltage difference that is larger than the voltage difference between the power-supply voltage applied node and the semiconductor substrate in the normal operation of the semiconductor device. This accomplishes rising of the threshold voltage, reduction of current, and reduction of the current driving force for the gate type transistor that turns on, or the transistor that has low threshold voltage, or for the transistor that has same threshold voltage as others and flow large current, or the transistor that has high current drive force. This accomplishes the reduction of the variation among the gate type transistors of the semiconductor device. In this case, the reduction of the variation among a plurality of the gate type transistors is accomplished just by adjusting voltage that is applied to the voltage applied node and voltage that is applied to the semiconductor substrate. This accomplishes the improvement of the voltage characteristic of the semiconductor device by simpler method.

In one preferable application of the voltage characteristic regulating method of the semiconductor device according to the above aspect of the invention, the control voltage is allowed to be adjusted so that voltage difference between the word line and the ground voltage applied node becomes voltage difference that turns off the first and second transistors, the preset low voltage is allowed to be applied to the power-source voltage applied node, the normal operation substrate voltage is allowed to be applied to the semiconductor substrate. Then at least one of voltage applied to the power-supply voltage applied node and voltage applied to the semiconductor substrate is allowed to be adjusted so that the voltage difference between the power-supply voltage applied node and the semiconductor substrate becomes equal to or higher than the preset voltage difference. The control voltage is adjusted so that voltage difference between the word line and the ground voltage applied node becomes voltage difference that turns on the first and second transistors, the preset low voltage is applied to the power-source voltage applied node, the first bit line, and the second bit line, and the normal operation substrate voltage is applied to the semiconductor substrate. Then the control voltage is adjusted so that the voltage difference between the word line and the ground voltage applied node becomes higher than voltage difference that turns off the first and second transistors, at least one of voltage applied to the power-supply voltage applied node and voltage applied to the semiconductor substrate is adjusted so that the voltage difference between the power-supply voltage applied node and the semiconductor substrate becomes equal to or higher than the preset voltage difference.

In another preferable application of the voltage characteristic regulating method of the semiconductor device according to the above aspect of the invention, each of the first transistor and the third transistor includes a stacked structure. The stacked structure includes an insulating layer between a pinned layer and a free layer. The pinned layer is formed from first magnetic material, formed so that direction of magnetization is fixed, and connected with a source of one of the first transistor and the third transistor connected with the structure. The free layer is formed from second magnetic material, formed so that direction of magnetization is able to vary, and connected with the power-supply voltage applied node. The insulating layer is formed from insulating material having preset isolation performance. Each of the second transistor and the fourth transistor includes a stacked structure. The stacked structure includes an insulating layer between a pinned layer and a free layer. The pinned layer is formed from first magnetic material, formed so that direction of magnetization is fixed, and connected with a drain of one of the first transistor and the third transistor connected with the structure. The free layer is formed from second magnetic material, formed so that direction of magnetization is able to vary, and connected with the ground voltage applied node. The insulating layer is formed from insulating material having preset isolation performance. In this case, the control voltage is adjusted so that voltage difference between the word line and the ground voltage applied node becomes voltage difference that turns off the first and second transistors. The preset low voltage is applied to the power-source voltage applied node. The normal operation substrate voltage is applied to the semiconductor substrate. Voltages applied to the first bit line, the second bit line, and the ground voltage applied node are adjusted so that voltage differences between the first bit line, the second bit line, and the ground voltage applied node become normal bit voltage that is applied to the first bit line, the second bit line, and the ground voltage applied node in the normal operation. Then the control voltage is adjusted so that the voltage difference between the word line and the ground voltage applied node becomes higher than voltage difference that turns on the first and second transistors. At least one of voltage applied to the power-supply voltage applied node and voltage applied to the semiconductor substrate is adjusted so that the voltage difference between the power-supply voltage applied node and the semiconductor substrate becomes equal to or higher than the preset voltage difference. The voltages applied to the first bit line, the second bit line, and the ground voltage applied node are adjusted so that the voltage differences between the first bit line, the second bit line and the ground voltage applied node become higher than the normal bit voltage. The control voltage is adjusted so that voltage difference between the word line and the ground voltage applied node becomes voltage difference that turns off the first and second transistors. The preset low voltage is applied to the power-source voltage applied node, the normal operation substrate voltage is applied to the semiconductor substrate, and voltages applied to the first bit line, the second bit line, and the ground voltage applied node are adjusted so that voltage differences between the first bit line, the second bit line, and the ground voltage applied node become normal bit voltage that is applied to the first bit line, the second bit line and the ground voltage applied node in the normal operation. Then the control voltage is adjusted so that the voltage difference between the word line and the ground voltage applied node becomes higher than voltage difference that turns on the first and second transistors. At least one of voltage applied to the power-supply voltage applied node and voltage applied to the semiconductor substrate is adjusted so that the voltage difference between the power-supply voltage applied node and the semiconductor substrate becomes equal to or higher than the preset voltage difference. The voltages applied to the first bit line, the second bit line, and the ground voltage applied node are adjusted so that the voltage differences between the first bit line, the second bit line, and the ground voltage applied node become zero.

In one preferable application of the voltage characteristic regulating method of the semiconductor device according to the above aspect of the invention, the first transistor is connected with the first bit line via a stacked structure. The stacked structure includes an insulating layer between a pinned layer and a free layer. The pinned layer is formed from first magnetic material, formed so that direction of magnetization is fixed, and connected with a source of one of the first transistor and the third transistor connected with the structure. The free layer is formed from second magnetic material, formed so that direction of magnetization is able to vary, and connected with the power-supply voltage applied node. The insulating layer formed from insulating material having preset isolation performance. Then the second transistor is connected with the second bit line via a stacked structure. The stacked structure includes an insulating layer between a pinned layer and a free layer. The pinned layer is formed from first magnetic material, formed so that direction of magnetization is fixed, and connected with a drain of one of the first transistor and the third transistor connected with the structure. The free layer is formed from second magnetic material, formed so that direction of magnetization is able to vary and connected with the ground voltage applied node. The insulating layer is formed from insulating material having preset isolation performance. In this case, the control voltage is adjusted so that voltage difference between the word line and the ground voltage applied node becomes voltage difference that turns on the first and second transistors. The preset low voltage is applied to the power-source voltage applied node. The normal operation substrate voltage is applied to the semiconductor substrate. The voltages applied to the first bit line, the second bit line and the ground voltage applied node are adjusted so that voltage differences between the first bit line, the second bit line and the ground voltage applied node become normal bit voltage that is applied to the first bit line, the second bit line and the ground voltage applied node in the normal operation. Then the control voltage is adjusted so that the voltage difference between the word line and the ground voltage applied node becomes higher than voltage difference that turns on the first and second transistors. At least one of voltage applied to the power-supply voltage applied node and voltage applied to the semiconductor substrate is adjusted so that the voltage difference between the power-supply voltage applied node and the semiconductor substrate becomes equal to or higher than the preset voltage difference. The voltages applied to the first bit line, the second bit line and the ground voltage applied node are adjusted so that the voltage differences between the first bit line, the second bit line and the ground voltage applied node become zero.

According to one aspect, the present invention is directed to a threshold voltage regulating method of a gate type semiconductor regulating threshold voltage of a plurality of the gate type transistors formed in a semiconductor substrate. The threshold voltage regulating method of the gate type semiconductor includes adjusting at least one of voltage applied to a gate and voltage applied to a drain of a plurality of the gate type transistors so that voltage difference between each drain and each source of the gate type transistor becomes equal to or larger than preset voltage difference that is larger than the voltage difference between the gate and the source of the gate type transistor.

In the threshold voltage regulating method of a gate type semiconductor according to this aspect of the invention, at least one of voltage applied to a gate and voltage applied to a drain of a plurality of the gate type transistors are adjusted so that voltage difference between each drain and each source of the gate type transistor becomes equal to or larger than preset voltage difference that is larger than the voltage difference between the gate and the source of the gate type transistor. This accomplishes the adjustment of the threshold voltage of a plurality of the gate transistors.

According to one aspect, the present invention is directed to a voltage characteristic regulator of latch circuit regulating voltage characteristic of the latch circuit. The latch circuit includes a plurality of gate type transistors that are formed in a semiconductor substrate. The voltage characteristic regulating apparatus includes a voltage applying circuit applying first voltage and second voltage to a voltage applied node applied voltage thereto in normal operation of the latch circuit. The first voltage is able to causes the latch circuit a malfunction to the voltage applied node. The second voltage is able to nonvolatilely lower current driving force of the gate type transistor that is included in the latch circuit to the voltage applied node.

In the voltage characteristic regulator of latch circuit according to this aspect of the invention, the voltage characteristic regulator includes the voltage applying circuit applying the first voltage and the second voltage to the voltage applied node applied voltage thereto in the normal operation of the latch circuit. The first voltage is able to causes the latch circuit a malfunction to the voltage applied node. The second voltage is able to nonvolatilely lower current driving force of the gate type transistor that is included in the latch circuit to the voltage applied node. This accomplishes rising of the threshold voltage, reduction of current, and reduction of the current driving force for the gate type transistor that turns on, or the transistor that has low threshold voltage, or for the transistor that has same threshold voltage as others and flow large current, or the transistor that has high current drive force. This accomplishes the reduction of the variation among the gate type transistors. In this case, the reduction of the variation among a plurality of the gate type transistors is accomplished just by adjusting voltage that is applied to the voltage applied node and voltage that is applied to the semiconductor substrate. This accomplishes the improvement of the voltage characteristic by simpler method. In the above case, "nonvolatilely" means that the current driving force is almost maintained when applying voltage to the voltage applied node is stopped and then applying voltage to the voltage applied node is started again.

In one preferable application of the voltage characteristic regulator of latch circuit according to the above aspect of the invention, the voltage applying circuit includes one of a change over switch and a variable voltage generating circuit. The change over switch switching between applying the first voltage to the voltage applied node and applying the second voltage to the voltage applied node at least. The variable voltage generating circuit is able to generate the first voltage and the second voltage at least.

In another preferable application of the voltage characteristic regulator of latch circuit according to the above aspect of the invention, the voltage applying circuit applies preset low voltage that is lower than power-supply voltage in the normal operation of the latch circuit to a power-supply voltage applied node of the latch circuit that the power-supply voltage is applied thereto in normal operation of the latch circuit, applies normal operation substrate voltage that is applied in the normal operation to the semiconductor substrate, and adjusts at least one of voltage applied to the power-supply voltage applied node and voltage applied to the semiconductor substrate so that voltage difference between the power-supply voltage applied node and the semiconductor substrate is equal to or higher than the preset voltage difference that is larger than the voltage difference between the power-supply voltage applied node and the semiconductor substrate in the normal operation of the latch circuit. The preset low voltage that is lower than the power-supply voltage in the normal operation of the latch circuit is applied to the power-supply voltage applied node of the latch circuit that the power-supply voltage is applied thereto in normal operation of the latch circuit, and the normal operation substrate voltage applied in the normal operation is applied to the semiconductor substrate. This operation allows transistor that is included in a plurality of gate type transistors and has low threshold voltage to turn on. Then at least one of voltage applied to the power-supply voltage applied node and voltage applied to the semiconductor substrate is adjusted so that the voltage difference between the power-supply voltage applied node and the semiconductor substrate is equal to or higher than the preset voltage difference that is larger than the voltage difference between the power-supply voltage applied node and the semiconductor substrate in the normal operation of the latch circuit. This accomplishes rising of the threshold voltage, reduction of current, and reduction of the current driving force for the gate type transistor that turns on, or the transistor that has low threshold voltage, or for the transistor that has same threshold voltage as others and flow large current, or the transistor that has high current drive force. This accomplishes the reduction of the variation among the gate type transistors. In this case, the reduction of the variation among a plurality of the gate type transistors is accomplished just by adjusting voltage that is applied to the voltage applied node and voltage that is applied to the semiconductor substrate. This accomplishes the improvement of the voltage characteristic by simpler method.

BRIEF DESCRIPTION OF THE DRAWINGS

FIG. 7 schematically illustrates a bias condition of a transistor turning on;

FIG. 24 schematically illustrates voltage regulating processes regulating voltage characteristic of the SRAM 10 of the third embodiment;

FIG. 25 schematically illustrates a circuit of the memory cell 12 of fourth embodiment;

BEST MODES OF CARRYING OUT THE INVENTION

One mode of carrying out the invention is described below as a preferred embodiment.

Figure 1:
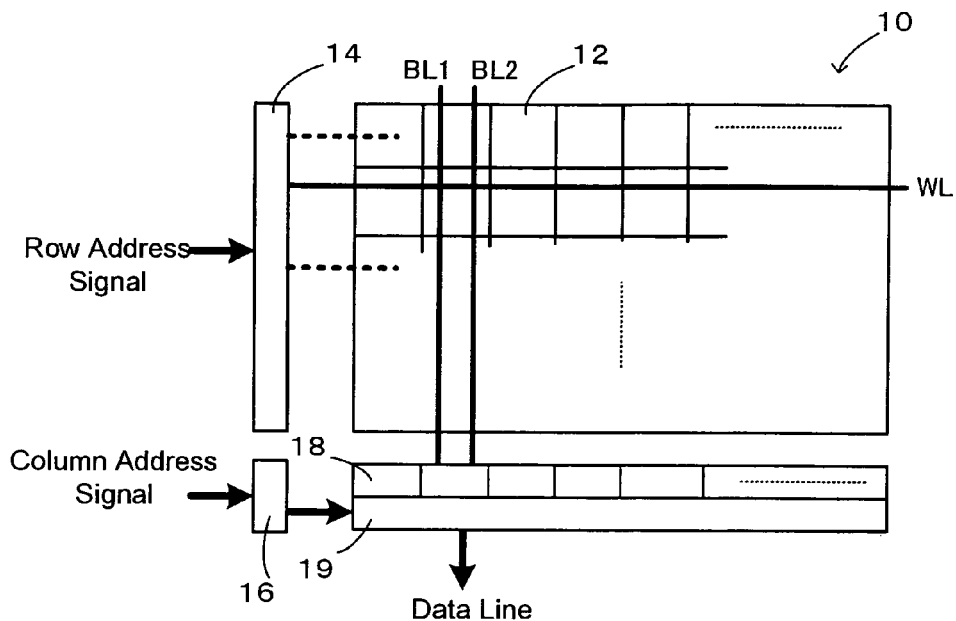
FIG. 1 schematically illustrates a configuration of a SRAM 10 including a memory cell 12 as a latch circuit that voltage thereof is adjusted by a voltage regulating method of a latch circuit of one embodiment of the invention.

FIG. 1 schematically illustrates a configuration of a SRAM (Static Random Access memory) 10 including a memory cell 12 as a latch circuit that voltage thereof is adjusted by a voltage regulating method of a latch circuit of one embodiment of the invention. The SRAM 10 includes a plurality of the memory cells 12 placed in a matrix state and connected with a plurality of word lines WL and a plurality of bit lines BL1 and BL2, a row decoder 14 selecting word line WL corresponding to a given row address signal when the row address signal is given, a column decoder 16 selecting a pair of bit lines BL1 and BL2 corresponding to a given column address signal when the column address signal is given, a plurality of sense amps 18 amplifying signals that are output from the memory sells 12 to the bit lines BL1 and BL2, a column selector 19 connecting the selected bit lines BL1 and BL2 with data lines that are input or output data and are not illustrated. In the memory cells 12, a plurality of memory cells 12 placed in the same rows are connected with the same word line WL. A plurality of memory cells 12 placed in the same columns are connected with a pair of the bit lines BL1 and BL2.

Figure 2:
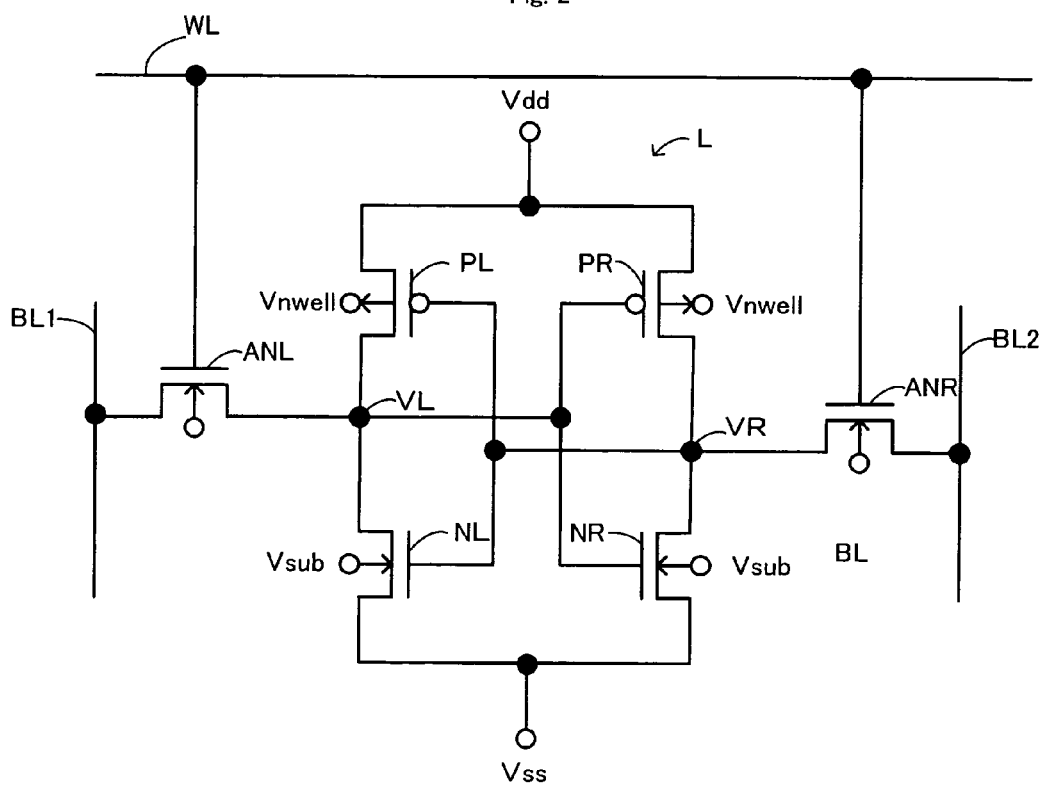
FIG. 2 schematically illustrates a circuit of the memory cell 12.

FIG. 2 schematically illustrates a circuit of the memory cell 12. The memory cell 12 includes a P channel MOS transistor PL, an n channel MOS transistor NL, a P channel MOS transistor PR, an n channel MOS transistor NR, an n channel MOS transistor ANL, and an n channel MOS transistor ANR. A drain of the P channel MOS transistor PL (described below as a transistor PL) is connected with a drain of the n channel MOS transistor NL (described below as a transistor NL), and a gate of the transistor PL is connected with a gate of the transistor NL. A drain of the P channel MOS transistor PR (described below as a transistor PR) is connected with a drain of the n channel MOS transistor NR (described below as a transistor NR) the transistor NR, and a gate of the transistor PR is connected with a gate of the transistor NR. Connecting node VR (described below as a node VR) of drains of transistor PR and NR is connected with the gates of transistor PL and NL, the gates of transistor PR and NR is connected with connecting node VL (described below as a node VL) of drains of transistor PL and NL. The n channel MOS transistor ANL (described below as an access transistor ANL) electrically connects the bit line BL1 with the node VL when the gate is connected the word line WL and the access transistor ANL is turned on. The access transistor ANL electrically disconnects the bit line BL1 with the node VL when the access transistor ANL is turned off. The n channel MOS transistor ANR (described below as an access transistor ANR) electrically connects the bit line BL2 with the node VR when the gate is connected the word line WL and the access transistor ANR is turned on. The access transistor ANR electrically disconnects the bit line BL2 with the node VR when the access transistor ANR is turned off. Sources of the transistors PL and PR are connected with a voltage applied node Vdd that a power supply voltage is applied thereto in a normal operation. Sources of the transistors NL and NR are connected with a ground voltage applied node Vss that a ground voltage is applied thereto in the normal operation. In the embodiment, a circuit configured by the transistor PL, PR, NL and NR equivalent to the 'latch circuit'.

Figure 3:
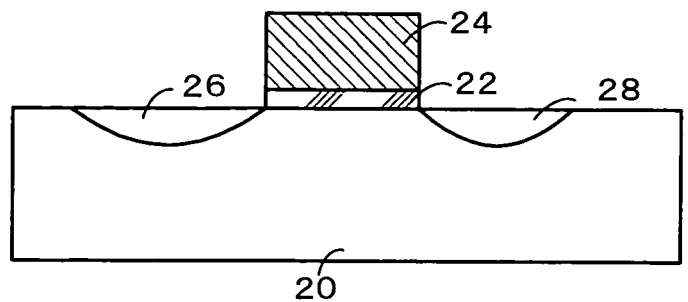
FIG. 3 schematically illustrates a construction of transistors NL and NR in section.

Configuration of transistor PL, PR, NL and NR and the access transistor ANL and ANR are described below. As illustrated in FIG. 3, each of the transistor NL and NR and the access transistor ANL and ANR is configured as well-known nMOS transistor. Each of the transistor NL and NR and the access transistor ANL and ANR includes an insulating layer 22 formed from material having high isolation performance such as silicon dioxide ($SiO_2$) and formed on a semiconductor substrate 20 that is formed from semiconductor material such as p-conductivity silicon (Si), a gate 24 formed from metallic material such as polysilicon and formed on the insulating layer 22, a source 26 and a drain 28 formed as a n-conductivity diffusion layer in the semiconductor substrate 20. An area inferior to the insulation layer 22 of the semiconductor substrate 20 is sandwiched between the source 26 and the drain 28. As illustrated FIG. 4, each of the transistors PL and PR is configured as well-known pMOS transistor. Each of the transistors PL and PR includes an insulating layer 32 formed from material having high isolation performance such as silicon dioxide ($SiO_2$) and formed on a well 30 that is formed from semiconductor material such as n-conductivity silicon (Si), a gate 34 formed from metallic material such as polysilicon and formed on the insulating layer 32, a source 36 and a drain 38 formed as a p-conductivity diffusion layer in the well 30. An area inferior to the insulation layer 32 of the well 30 is sandwiched between the source 36 and the drain 38. The transistors PL, PR, NL, and NR and the access transistors ANL and ANR are formed on the same semiconductor substrate 20. The transistors PL and PR are isolated from the transistors NL and NR and the access transistors ANL and ANR by oxide film that is not illustrated and has high isolation performance.

In the SRAM 10 configured above, voltages are basically applied to the power-supply voltage applied node Vdd, the ground voltage applied node Vss, the semiconductor substrate 20 and the well 30 so that the voltage Vdd applied to the power-supply voltage applied node Vdd is set to be value of V1 (for example, 1.2V), the ground voltage Vss applied to the ground voltage applied node Vss is set to be 0V, the substrate voltage Vsub applied to the semiconductor substrate 20 is set to be 0V, and well voltage Vnwell is set to be value of V1. Applying voltage to all memory cells 12 is executed collectively. With voltages described above applied to the power-supply voltage applied node Vdd, the ground voltage applied node Vss, the semiconductor substrate 20 and the well 30, operation such as data write operation, data readout operation or data retention operation is executed. The memory cell 12 works as a circuit having bistable state. The bistable state is that the node VR is in a low voltage state (described below as L level) when the node VL is in a high voltage state (described below as H level) and the node VR is the H level when the node VL is the L level. Change of voltage of the nodes VL or VR from the H level to the L level or from the L level to the H level is defined as "level inversion".

The data write operation is executed by steps specifically described below. When signals necessary for the operation such as the row address signal or the column address signal are given and voltages of bit lines BL1 and BL2 (described below as bit line voltage VBL1 and VBL2) are set to be voltages corresponding to data to be written, one word line WL is selected based on the row address signal by row decoder 12. The voltage of word line WL (described below as word line voltage VWL1) becomes value of V1, and column decoder 14 selects a pair of bit lines BL1 and BL2 based on the input column address signal. Then, in the memory cell 12 connected with the selected word line WL and the bit lines BL1 and BL2, voltages of the node VL and VR are set to be voltages corresponding to the bit lines BL1 and BL2. Thus the data write operation is executed. The data readout operation is executed by steps specifically described below. When signals necessary for the operation such as the row address signal or the column address signal are given and voltages Vdd (values of V1) applied to the power-source applied node Vdd is applied to the bit lines BL1 and BL2, in the memory cell 12 connected with the word line WL and the bit lines BL1 and BL2 that are selected by the row decoder 12 and the column decoder 14, voltage difference between the bit lines BL1 and BL2 generated by and corresponding to voltage difference between the nodes VL and VR is read out as data. Thus the data readout operation is executed. Data retention operation is executed by turning off the access transistors ANL and ANR and retaining voltages of the nodes VL and VR of the memory cell 12 as data with all word lines WL and all bit lines BL1 and BL2 not selected.

Figure 5:
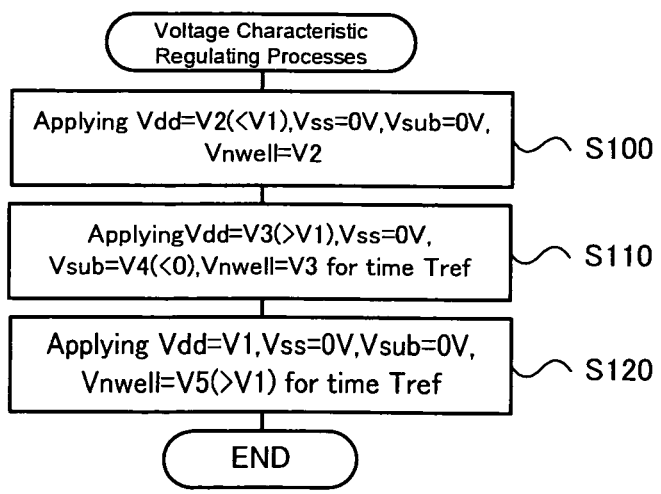
FIG. 5 schematically illustrates voltage characteristic regulating processes regulating voltage characteristic of the SRAM 10 during data retention.

Voltage characteristic regulating method of the SRAM 10 during the data retention is described below. FIG. 5 schematically illustrates voltage characteristic regulating processes regulating voltage characteristic of the SRAM 10 during the data retention. These processes are executed with all word lines WL of memory cells 12 not selected (the word line voltage Vw1 is set to be 0V) and the access transistors ANL and ANR of all memory cells 12 turned off.

Figure 6:
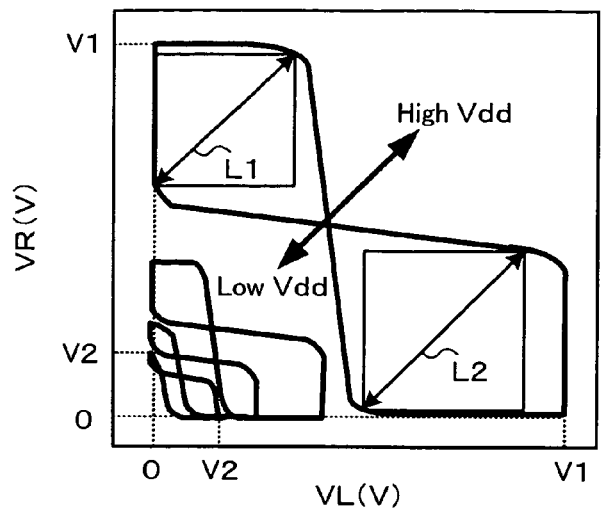
FIG. 6 schematically illustrates a voltage characteristic of the memory cell 12 when voltage Vdd is gradually decreased from value of V1.

First, voltage is applied to each of the power-supply voltage applied node Vdd, the ground voltage applied node Vss, the semiconductor substrate 20 and the well 30 of all memory cells of the SRAM 10 so that value of voltage Vdd becomes value of V2 (for example, 0.3V) lower than V1, the ground voltage Vss and the substrate voltage Vsub become 0V, and value of the well voltage Vnwell becomes value of V2 (step S100). Owing to variation of threshold voltages of then transistors PL, PR, NL and NR, Value preliminarily obtained by experiment or analysis as voltage that is unable to invert and fixes levels of the nodes VL and VR to either H level or L level when the voltage Vdd is gradually decreased from the value of V1. FIG. 6 schematically illustrates voltage characteristic of the memory cell 12 when the voltage Vdd is gradually decreased from the value of V1. In this figure, voltage of the node VR in applying voltage of from 0V to value V1 to the node VR of the memory cell 12 and voltage of the node VL in applying voltage of from 0V to value V1 to the node VR of the memory cell 12 are described in the same graph. Two largest squares that are inscribed in two curves obtained above are drawn. Retention noise margin ReNM is set to length of shorter diagonal line of diagonal line L1 and L2 of the two squares (in FIG. 6, length of the diagonal line L1). As illustrated, the memory cell 12 does not show bistable state at certain voltage (value of V2 of the embodiment) when the voltage Vdd is gradually decreased. As a result, the levels of the nodes VR and VL are unable to be inverted, and the node VR is fixed to ether H level of L level. This is because potentials of the node VL and VR are decided by balance of threshold voltages of the transistors PL, PR, NL and NR, transistor that has lower threshold voltage is turned on and the voltage of the node VR and VL are fixed to turn-on voltage of the transistor when the threshold voltages of the transistor PL, PR, NL and NR vary and the voltage Vdd becomes value of V2. Each State of the transistors of the memory cell 12 after executing a process of the step S100 reflects variation in the threshold voltage, and the transistor that has lower threshold voltage is turned on. For illustrative purposes, the threshold voltage of the transistor PL and NR is set to be lower than that of the transistor PR and NL, the transistor PL and NR is set to be turned on, the node VL of the memory cell 12 is set to be H level, and the node VR of the memory cell 12 is set to be L level.

Then voltage is applied to each of the power-supply voltage applied node Vdd, the ground voltage applied node Vss, the semiconductor substrate 20 and the well 30 of all memory cells of the SRAM 10 for time Tref (for example, 600 second) so that value of voltage Vdd becomes value of V3 (for example, 3.5V) higher than V1, the substrate voltage Vsub becomes value of V4 (for example, −6V) lower than voltage (for example, 0V) applied in normal operation in SRAM 10, the ground voltage Vss becomes 0V, and value of the well voltage Vnwell becomes value of V3 (step S110). This process accomplishes rising of the threshold voltage of the transistor that is turned on of the transistors NL and NR. The reason why this process is executed is described below.

Figure 7:
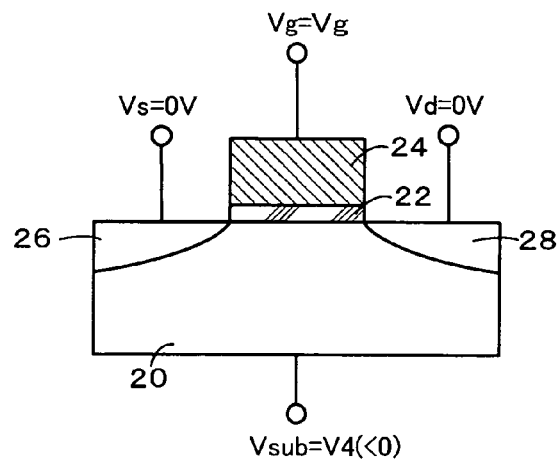

FIG. 7 schematically illustrates a condition of applying voltage (described below as a bias condition) of the transistor NR. When the transistor NR is turned on, the bias condition is that gate voltage Vg applied to the gate 24 is value of V3, source voltage Vs applied to the source 26 and drain voltage Vd applied to the drain 28 are 0V, and the substrate voltage Vsub is value of V4. Voltage difference between the gate 24 and the semiconductor 20 is higher than voltage difference between the gate 24 and the semiconductor 20 in the normal operation of the memory cell 12 (in the embodiment, 1.5V). Comparatively high energy electrons are injected from the semiconductor substrate 20 into the insulating layer 22. This injection raises the threshold voltage of the transistor NR. This phenomenon is called Substrate Hot electron injection (SHE). Occurrence of SHE enables to raise the threshold voltage of the transistor.

Figure 8:
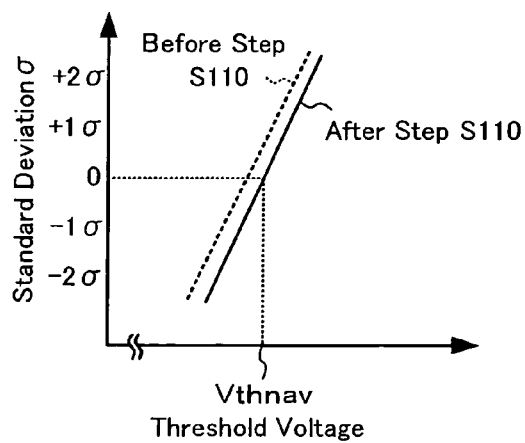
FIG. 8 schematically illustrates variation in threshold voltage in transistors NR of all memory cells 12 when voltage is applied to the all memory cells 12 in a bias condition of step S100 of the first embodiment.
Figure 9:
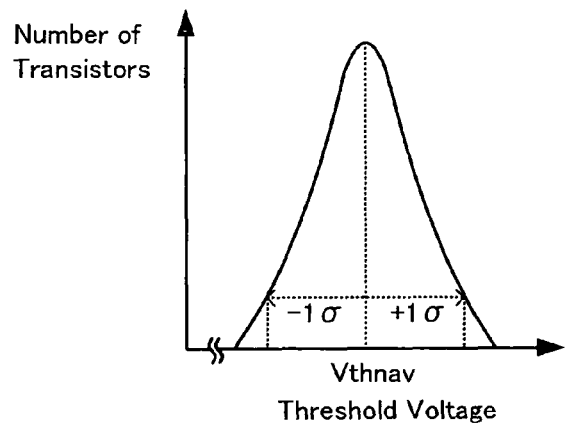
FIG. 9 schematically illustrates relation between the threshold voltage and dispersion a assuming that relation between the threshold voltage and number of transistors NR is normal distribution curve.

FIG. 8 schematically illustrates the variation in threshold voltage in the transistors NR of all memory cells 12 when voltage is applied to the all memory cells 12 in the bias condition of step S110. In the FIG. 8, dashed line indicates the variation in threshold voltage in the transistors NR before executing a process of the step S110. Solid line indicates the variation in threshold voltage in the transistors NR after executing a process of the step S110. In the FIG. 8, horizontal axis indicates the threshold voltage. Longitudinal axis indicates, as illustrated in FIG. 9, dispersion σ from mean value Vthnav of the threshold voltage assuming that relation between the threshold voltage and number of the transistors NR is normal distribution curve. In FIG. 8, the threshold voltage of the dispersion that is value of 0 is the mean value Vthnav. The steeper the slope is, the less the variation of the threshold voltage of the transistor NR is. As illustrated in FIG. 8, the threshold voltage of the transistor NR after executing the process of the step S110 is higher than before executing the process of the step S110. The threshold voltage of the turn-off transistor NL does not vary after and before the process of the step S110 because the SHE is not occurred. The process of the step S110, as described above, is able to change the threshold voltage of the turn-on transistor close to that of turn-off transistor. This accomplishes the reduction of the variation in the threshold voltage between the transistor NR and NL of the memory cell 12. The reduction of the variation in the threshold voltage is accomplished just by applying relative high voltage, such as voltage raising the threshold voltage of the transistor NR between the semiconductor substrate 20 and the gates 24 of all memory cells 12 of the SRAM 10. This accomplishes improvement of the variation in the threshold voltage between the transistor NR and NL of the memory cell 12 by simpler method.

Figure 10:
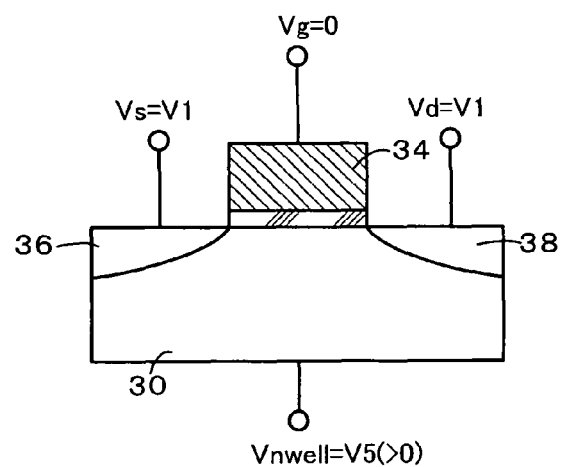
FIG. 10 schematically illustrates a bias condition of a transistor turning on of the transistors PL and PR.

Voltage is applied to each of the power-supply voltage applied node Vdd, the ground voltage applied node Vss, the semiconductor substrate 20 and the well 30 of all memory cells of the SRAM 10 for time Tref so that value of voltage Vdd becomes value of V1, the substrate voltage Vsub and the ground voltage Vss become 0V, and value of the well voltage Vnwell becomes value of V5 higher than voltage (for example, 0V) applied in normal operation in SRAM 10 (step S120). Then the voltage characteristic regulating process is terminated. This process accomplishes rising of the threshold voltage of the transistor PL. FIG. 10 schematically illustrates a bias condition of the transistors PL. In the transistor PL, as illustrated in FIG. 10, the bias condition is that gate voltage Vg applied to the gate 34 is 0V, source voltage Vs applied to the source 36 and drain voltage Vd applied to the drain 38 are value of V1, and the well voltage Vnwell is value of V5. Voltage difference between the gate 34 and the well 30 is higher than voltage difference between the gate 34 and the well 30 in the normal operation of the memory cell 12 (in the embodiment, 1.5V). Comparatively high energy holes are injected from the sell 30 into the insulating layer 32. This injection raises the threshold voltage of the transistor PL. The threshold voltage of the turn-off transistor does not vary after and before the process of the step S120 because the injection of holes is not occurred. The process of the step S120, as described above, is able to raise the threshold voltage of only turn-on transistor PL of the memory cell 12 close to that of turn-off transistor PR. This accomplishes the reduction of the variation in the threshold voltage between the transistor NR and NL of the memory cell 12. The reduction of the variation in the threshold voltage is accomplished just by applying relative high voltage, such as voltage raising the threshold voltage of the transistor NR between the well 30 and the gates 32 of all memory cells 12 of the SRAM 10. This accomplishes improvement of the variation in the threshold voltage between the transistors PR and PL of the memory cell 12 by simpler method.

Figure 11:
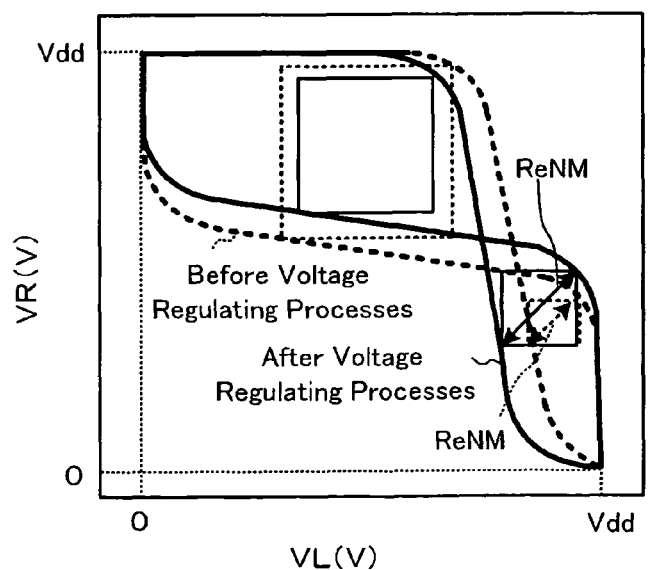
FIG. 11 schematically illustrates voltage characteristic of the memory cell 12 before and after executing voltage regulating processes of the first embodiment.

FIG. 11 schematically illustrates voltage characteristic of the memory cell 12 before and after executing voltage regulating processes of the first embodiment. In this figure, voltage of the node VR in applying voltage of from 0V to the value of Vdd (for example, 0.3V) to the node VL of the memory cell 12 and voltage of the node VL in applying voltage of from 0V to the value of Vdd to the node VR of the memory cell 12 before executing the voltage characteristic regulating process are described in the same graph as a dashed line. The Voltage of the node VR in applying voltage of from 0V to the value of Vdd to the node VL of the memory cell 12 and the voltage of the node VL in applying voltage of from 0V to the value of Vdd to the node VR of the memory cell 12 after executing the voltage characteristic regulating process are described in the same graph as a dashed line. This curve is call butterfly curve. As illustrated in this figure, the retention noise margin ReNM is larger and the voltage characteristic is better after executing the voltage characteristic regulating process.

Figure 12:
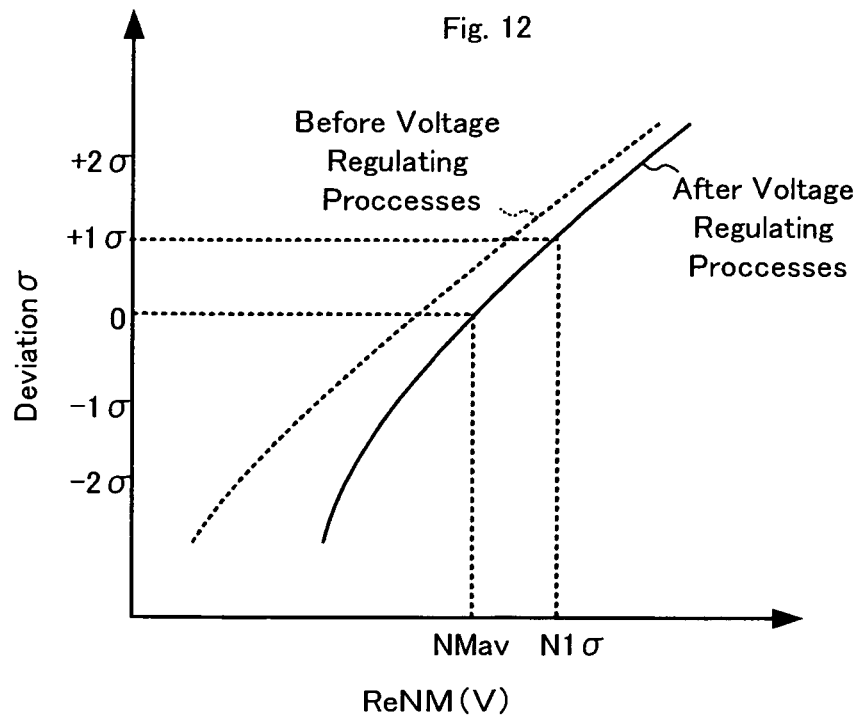
FIG. 12 schematically illustrates variation in retention noise margin ReNM of memory cells 12 before and after ending of voltage regulating processes.

FIG. 12 schematically illustrates the variation in the retention noise margin ReNM of memory cells 12 before and after ending of voltage regulating processes. In this figure, the variation in the retention noise margin ReNM before executing the voltage characteristic regulating processes is described as a dashed line. The variation in the retention noise margin ReNM after executing the voltage characteristic regulating processes is described as a solid line. In the FIG. 12, horizontal axis indicates the retention noise margin. Longitudinal axis indicates, as is the case in the FIG. 9, the dispersion a from the mean value NMav assuming that relation between the threshold voltage and number of the transistors NR is normal distribution curve. In FIG. 12, the steeper the slope is, the less the variation of the threshold voltage of the memory cell 12. As illustrated in FIG. 12, the variation of the retention noise margin ReNM after executing the voltage characteristic regulating processes is smaller than before executing the voltage characteristic regulating processes. This accomplishes the improvement of the voltage characteristic of the memory cell 12 in the data retention operation by executing the voltage characteristic regulating processes and fall of minimum operation voltage Vmin that enables the SRAM 10 to operate (the highest voltage of minimum operation voltages Vmincell that enables each memory cell to operate). The reduction of the variation in the threshold voltage is accomplished just by adjusting voltage as described above to all memory cells 12 configuring the SRAM 10. This accomplishes the improvement of the variation in the threshold voltage of all memory cells 12 and improvement of the voltage characteristic by simpler method.

By executing the processes of the steps S110 and S120, the threshold voltage varies toward the variation in the threshold voltage occurring in the memory cell 12 that the variation in the threshold voltage of the transistors NR, NL, PR, and PL does not occur therein. The threshold voltage of this type of the transistor is normally about the mean value Vthnav. The threshold voltage of the turn-on transistor is raised slightly. The effect on the voltage character of the whole SRAM 10 is very small.

In the voltage characteristic regulating process of the first embodiment, the voltage Vdd is set to be lower than voltage applied in the normal operation with the access transistors ANL and ANR turned off by applying the word lines WL to voltage of 0V. These processes allow transistor having low threshold voltage of the transistors PL, PR, NL and NR included in the memory cell 12 to turn on. Then voltage is applied to each of the power-supply voltage applied node Vdd, the ground voltage applied node Vss, the semiconductor substrate 20 and the well 30 so that relative high voltage that raise the threshold voltage of the turn-on transistor are applied between the gate 24 of turn-on transistor and the semiconductor substrate 20 or the gate 30 of turn-on transistor and well 30. This process accomplishes rising of the threshold voltage of the transistor that is turned on, the reduction of the variation in the threshold voltage between the transistors PL, PR NR and NL of the memory cell 12, and the improvement of the voltage characteristic of the memory cell 12 in the data retention operation. The reduction of the variation in the threshold voltage is accomplished just by adjusting voltages applied to the power-supply voltage applied node Vdd, the ground voltage applied node Vss, the semiconductor substrate 20 and the well 30. This accomplishes the improvement of the voltage characteristic of the memory cell 12 by simpler method. The reduction of the variation in the threshold voltage is accomplished just by adjusting voltage as described above to all memory cells 12 configuring the SRAM 10. This accomplishes the improvement of the variation in the threshold voltage of all memory cells 12 and improvement of the voltage characteristic by simpler method.

Voltage characteristic regulating method of the latch circuit as second embodiment of the invention is described below. The voltage characteristic regulating processes of the second embodiment is the same as the voltage characteristic regulating processes illustrated in FIG. 5 except for executing the process of step S100B instead of a process of the step S100, and for executing a process of step S105 after the process of the step S100 B. Same symbol as symbol in FIG. 5 is attached to the same process as process in FIG. 5, and the same process as process in FIG. 5 is not explained.

Figure 13:
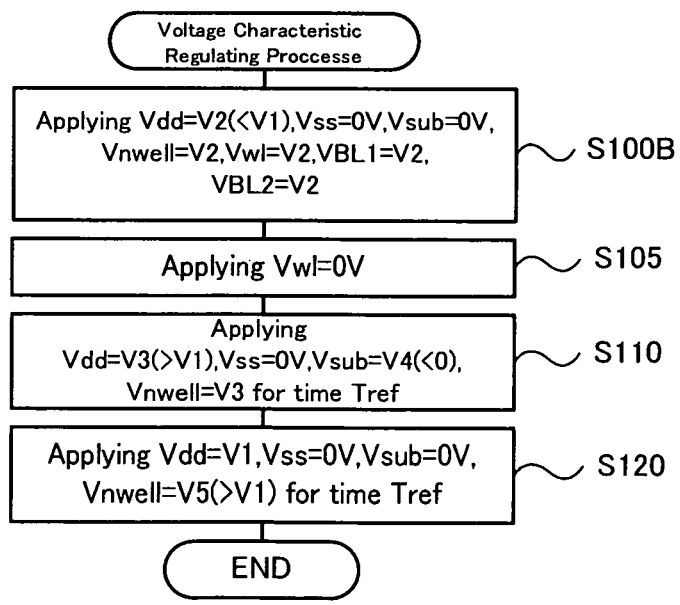
FIG. 13 schematically illustrates voltage characteristic regulating processes regulating voltage characteristic of the SRAM 110 during data readout of the second embodiment.

FIG. 13 schematically illustrates voltage characteristic regulating processes regulating voltage characteristic of the SRAM 10 in data readout operation of the second embodiment. In the second embodiment, the voltage characteristic in the data readout operation is adjusted. This is because that voltages of the node VL and VR in the data readout operation is affected by variation in the current of the access transistors ANL and ANR or the variation in the threshold voltage, and the voltage characteristic in the data read out operation is worse than the voltage characteristic in the data retention operation. Either voltage characteristic regulating processes of the first embodiment or the second embodiment is adapted according to characteristic of the SRAM 10.

Figure 14:
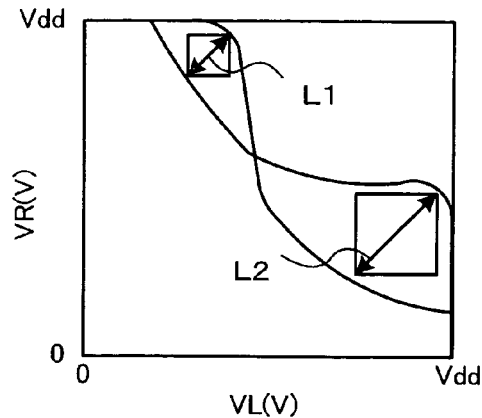
FIG. 14 schematically illustrates butterfly curve in applying voltage Vdd to word line WL and bit lines BL1 and BL2.

In the voltage characteristic regulating process of the second embodiment, voltages is applied to each of the power-supply voltage applied node Vdd, the ground voltage applied node Vss, the semiconductor substrate 20 and the well 30 of all memory cells of the SRAM 10 so that value of voltage Vdd becomes value of V2, the ground voltage Vss and the substrate voltage Vsub become 0V, and value of the well voltage Vnwell becomes value of V2. That is, the same voltage as voltage in the data readout operation (the same voltage as voltage Vdd, that is, value of V2) is applied to the all word lines WL and all bit lines BL1 and BL2 (step S100B). FIG. 14 schematically illustrates the butterfly curve in applying the voltage Vdd to the word line WL and the bit lines BL1 and BL2. Two largest squares that are inscribed in two curves obtained above are drawn. Static noise margin SNM is set to length of shorter diagonal line of diagonal line L1 and L2 of the two squares (in FIG. 14, length of the diagonal line L1). The butterfly curve in applying voltage Vdd to the word line WL and bit lines BL1 and BL2 reflects variation of the threshold voltage of the access transistors ANL and ANR and the transistors PL, PR, NL, and NR. Each State of the transistors of the memory cell 12 after executing the process of the step S100B reflects variation in the threshold voltage of the access transistors ANL and ANR and the transistors PL, PR, NL, and NR. For illustrative purposes, the threshold voltages of the transistors PL and NR and the access transistor ANL is set to be lower than that of the transistor PR and NL, the node VL of the memory cell 12 is set to be H level, and the node VR of the memory cell 12 is set to be L level after executing the process of the step S100B.

Then voltage applied to the word line is set to be 0V to turn off the access transistors ANL and ANR (step S105). The voltage is applied to each of the power-supply voltage applied node Vdd, the ground voltage applied node Vss, the semiconductor substrate 20 and the well 30 of all memory cells of the SRAM 10 for the time Tref so that value of voltage Vdd becomes value of V3, the substrate voltage Vsub becomes value of V4, the ground voltage Vss becomes 0V, and value of the well voltage Vnwell becomes value of V3 with the voltages applied to all word lines WL be 0V (step S110). Voltage is applied to each of the power-supply voltage applied node Vdd, the ground voltage applied node Vss, the semiconductor substrate 20 and the well 30 of all memory cells of the SRAM 10 for time Tref so that value of voltage Vdd becomes value of V1, the substrate voltage Vsub and the ground voltage Vss become 0V, and value of the well voltage Vnwell becomes value of V5 (step S120). Then the voltage characteristic regulating process is terminated. This process accomplishes rising of the threshold voltage of the transistor that is turned on of the transistors PL, PR, NL and NR, the reduction of the variation in the threshold voltage, and the fall of the minimum operation voltage Vmin in the data readout operation.

In the voltage characteristic regulating process of the second embodiment, the same voltages as voltage in the data readout operation (the same voltage as voltage Vdd, that is, value of V2) are applied to the all word lines WL and all bit lines BL1 and BL2, and the voltage Vdd is set to be lower than voltage applied in the normal operation. These processes allow transistor having low threshold voltage of the transistors PL, PR, NL and NR included in the memory cell 12 to turn on. Then voltage applied to the word line is set to be 0V to turn off the access transistors ANL and ANR, and voltage is applied to each of the power-supply voltage applied node Vdd, the ground voltage applied node Vss, the semiconductor substrate 20 and the well 30 so that relative high voltage that raises the threshold voltage of the turn-on transistor are applied between the gate 24 of turn-on transistor and the semiconductor substrate 20 or the gate 30 of turn-on transistor and well 30. This process accomplishes rising of the threshold voltage of the transistor that is turned on, the reduction of the variation in the threshold voltage between the transistors PL, PR NR and NL of the memory cell 12, the improvement of the voltage characteristic of the memory cell 12, and the improvement of the voltage characteristic of the memory cell 12 in the data readout operation.

Figure 15:
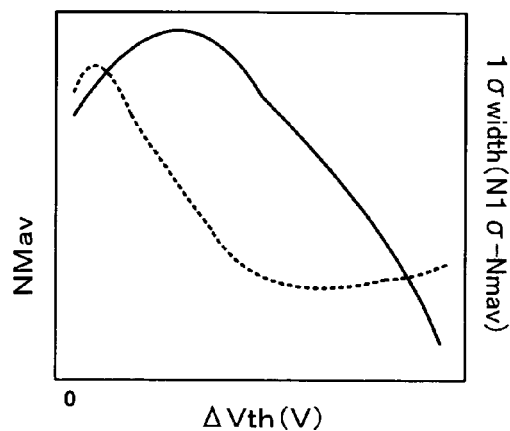
FIG. 15 schematically illustrates relation between amount of variation in threshold $\Delta$Vth, mean value NMav of retention noise margin ReNM, and relation between mount of variation in the threshold $\Delta$Vth and 1$\sigma$ width of the transistors turned on after executing process of step S110 of the first embodiment.
Figure 16:
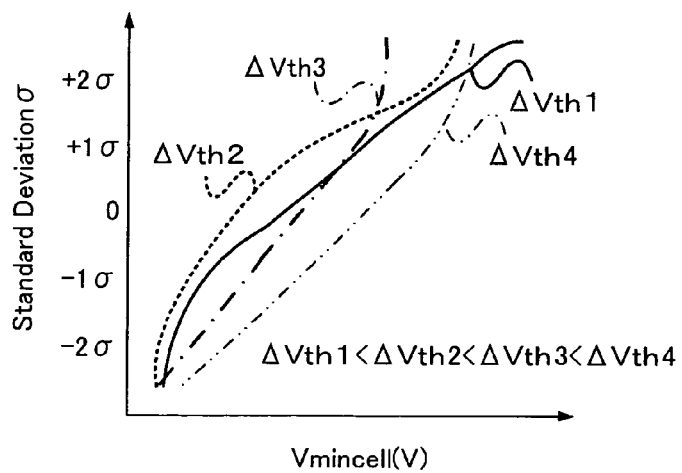
FIG. 16 schematically illustrates relation between the amount of the variation in the threshold $\Delta$Vth and variation in minimum operation voltage Vmincell of the first embodiment.
Figure 17:
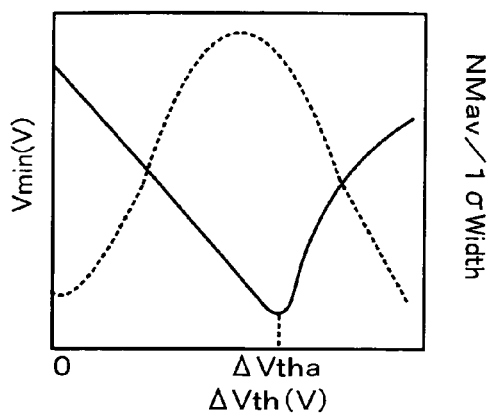
FIG. 17 schematically illustrates relation between the amount of the variation in the threshold $\Delta$Vth and the minimum operation voltage Vmincell, and relation between the amount of variation in the threshold $\Delta$Vth and value obtained by dividing the mean value NMav of retention noise margin ReNM by 1$\sigma$ width.
Figure 18:
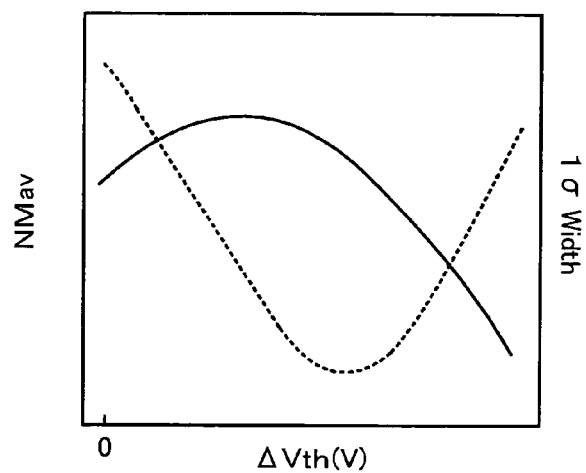
FIG. 18 schematically illustrates relation between the amount of the variation in the threshold $\Delta$Vth and mean value NMav of static noise margin SNM, and relation between the amount of the variation in the threshold $\Delta$Vth and 1$\sigma$ width after executing the process of the step S110.
Figure 19:
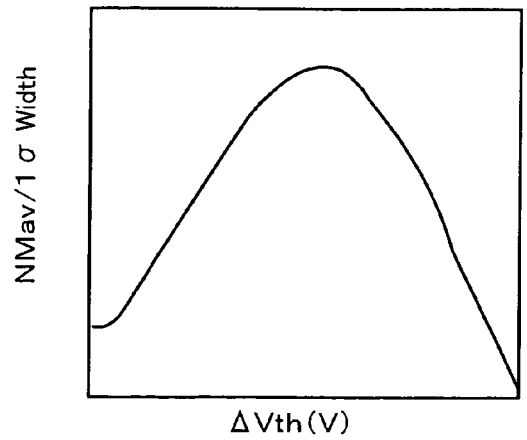
FIG. 19 schematically illustrates relation between the amount of the variation in the threshold $\Delta$Vth and value obtained by dividing the mean value NMav of the static noise margin SNM in FIG. 16 by the 1$\sigma$ width.
Figure 20:
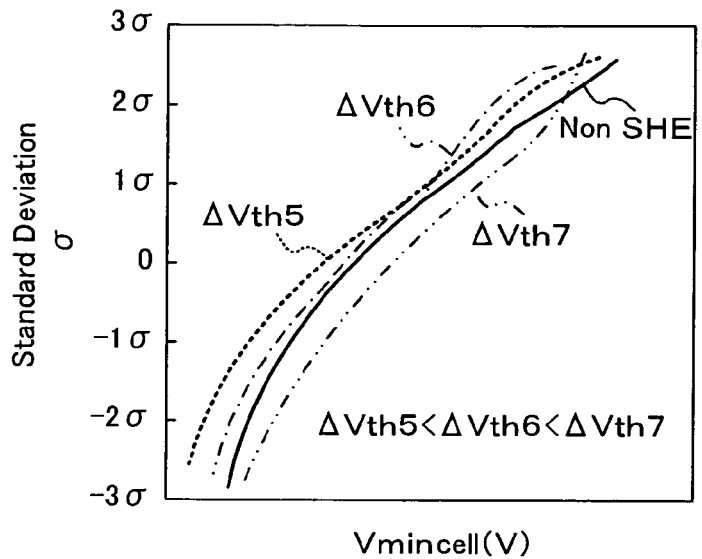
FIG. 20 schematically illustrates the relation between the amount of the variation in the threshold $\Delta$Vth and the variation in the minimum operation voltage Vmincell of the second embodiment.
Figure 21:
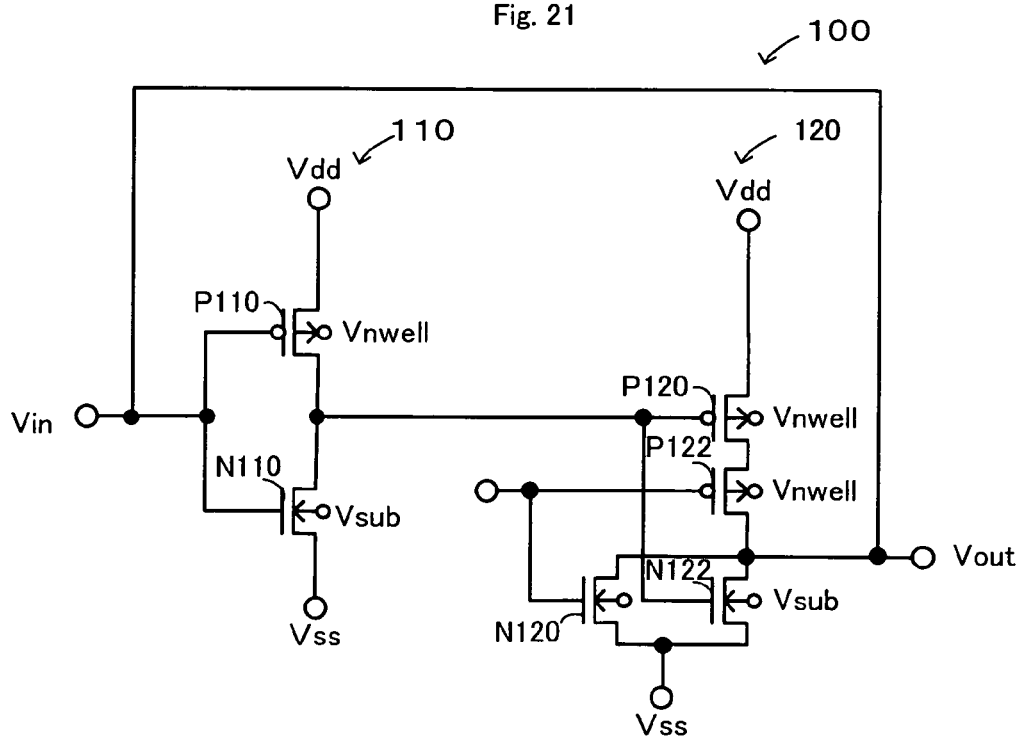
FIG. 21 schematically illustrates a circuit diagram of a latch circuit of modified circuit that voltage thereof is adjusted by the voltage regulating method of a latch circuit of the first and second embodiments.
Figure 22:
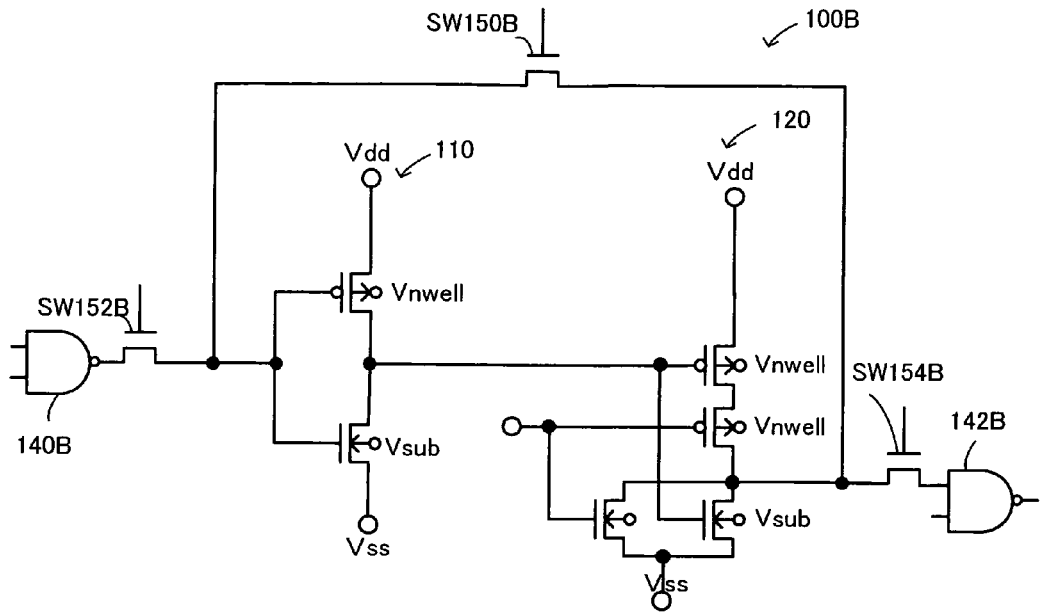
FIG. 22 schematically illustrates a circuit diagram of a latch circuit of another modified circuit that voltage thereof is adjusted by the voltage regulating method of a latch circuit of the first and second embodiments.

In the voltage characteristic regulating process of the first and second embodiment, the power-supply voltage Vdd, the substrate voltage Vsub, the well voltage Vnwell are set to be adjusted in the processes of the step S110 and S120. The voltages applied to the power-supply voltage applied node Vdd, the ground voltage applied node Vss, are allowed to be adjusted so that the voltage difference between the gate 24 and the semiconductor substrate 20 or the gate 30 and well 30 is equal to or more than voltage difference that is able to inject electrons or holes into the insulating layers 22 or 32 of the transistor that is turned on. Only power-supply voltage Vdd may be adjusted, and the substrate voltage Vsub and the well voltage Vnwell may be set to be voltage in the normal operation (value of V1) or 0V. The power-supply voltage Vdd may be set to be voltage in the normal operation, and the substrate voltage Vsub and the well voltage Vnwell may be adjusted In the voltage characteristic regulating process of the first and second embodiment, relative high voltage is set to be applied for time Tref in the step S110 and S120. The time for applying voltage may be adjusted accordingly. The time for applying voltage in the process of step S110 may be different from the time in the process of step S120. In the first embodiment, the time Tref is preferably set by a method described below. FIG. 15 schematically illustrates relation between amount of variation in threshold ΔVth and mean value NMav of retention noise margin ReNM (solid line), and relation between mount of variation in the threshold ΔVth and 1σ width of the transistors turned on (dashed line) before and after executing process of step S110. FIG. 16 schematically illustrates relation between the amount of the variation in the threshold ΔVth and variation in minimum operation voltage Vmincell. FIG. 17 schematically illustrates relation between the amount of the variation in the threshold ΔVth and the minimum operation voltage Vmin (the highest voltage of minimum operation voltages Vmincell that enables each memory cell to operate, solid line), and relation between the amount of variation in the threshold ΔVth and value obtained by dividing the mean value NMav of retention noise margin ReNM by 1σ width (dashed line). As illustrated in these figure, the minimum operation voltage Vmin is relative small, and value obtained by subtracting the 1σ width from the mean value NMav of the retention noise margin ReNM is relative large when the variation in the threshold voltage ΔVth is preset value (for example, value of ΔVtha in FIG. 17). The longer the time Tref for applying voltage to the transistor is, the larger the amount of increase in the variation in the threshold voltage ΔVth is considered to be. The relation illustrated in FIG. 17 is preliminary determined by experiment or analysis, and voltage is applied to the transistor for the time that is required by the variation in the threshold voltage ΔVth to become value of ΔVtha in the process of the step S110. These processes accomplish the improvement of the voltage characteristic of the SRAM 10. For the transistors PL and PR, the time required for applying the voltage to the transistor is set, and voltage is applied to the transistor for the set time in the process of the step S120. These processes accomplish the improvement of the voltage characteristic of the SRAM 10. In the voltage regulating processes of the second embodiment, similar to the voltage regulating processes of the first embodiment, the relation between the variation in the threshold voltage ΔVth, and the relation between the minimum operation voltage Vmin and the value obtained by subtracting the 1σ width from the mean value NMav of the static noise margin SNM is preliminary determined by experiment or analysis, and voltage is applied to the transistor for the time that is required by the variation in the threshold voltage ΔVth to become value of ΔVtha in the process of the step S110. These processes accomplish the improvement of the voltage characteristic of the SRAM 10. FIG. 18 schematically illustrates the relation between the amount of the variation in the threshold ΔVth and the mean value NMav of static noise margin SNM (solid line), and the relation between the amount of the variation in the threshold ΔVth and 1σ width (dashed line) before and after executing the process of the step S110. FIG. 19 schematically illustrates relation between the amount of the variation in the threshold ΔVth and value obtained by dividing the mean value NMav of the retention noise margin ReNM in FIG. 15 by the is width. FIG. 20 schematically illustrates the relation between the amount of the variation in the threshold ΔVth and the variation in the minimum operation voltage Vmincell. For the transistors PL and PR, the time required for applying high voltage to the transistor is set, and voltage is preferably applied to the transistor for the set time in the process of the step S120. These processes accomplish the improvement of the voltage characteristic of the SRAM 10 in the data readout operation.

In the voltage characteristic regulating process of the first and second embodiment, the process of the step S120 is set to be executed after the process of the step S110. The process of the step S110 may be set to be executed after the process of the step S120. The process of the step S110 and S120 may be set to be executed as one process. In this case, for example, voltages is applied to each of the power-supply voltage applied node Vdd, the ground voltage applied node Vss, the semiconductor substrate 20 and the well 30 for the time Tref so that the voltage Vdd becomes value of V3, the ground voltage Vss becomes 0V, the substrate voltage Vsub becomes value of V4 and the well voltage Vnwell becomes value of V5. Either the process of the step S110 or S120 may be set to be executed.

In the voltage characteristic regulating process of the first and second embodiment, the process of the step S120 or S105 is set to be executed after the process of the step S110 or S100B. The process of the step S110 or S105 may be executed after applying voltage lower than value of V1 to the power-supply voltage node Vdd. The process of the step S110 or S105 may be set to be executed immediately after voltage is applied to the power-supply voltage node Vdd of the SRAM 10 for the first time.

In the voltage characteristic regulating process of the first and second embodiment, the processes of the steps from S100 to S120 or from S100B to S120 is set to be executed once. The voltage difference between voltage Vdd and the substrate voltage Vsub in the process of the step S100 or the voltage difference between voltage Vdd and the well voltage Vnwell in the process of the step S120 may be set to be small, the processes of the steps from S100 to S120 or from S100B to S120 may set to be repeated more than once. The threshold voltage of the transistor NL becomes higher than that of the transistor NR when the threshold voltage of the transistor NL is lower than that of the transistor NR and the processes of the steps from S100 to S120 or from S100B to S120 is executed once. Then the threshold voltage of the transistor NR becomes high when the processes of the steps from S100 to S120 or from S100B to S120 are executed. This accomplishes the reduction of the variation in the threshold voltages of the transistors NR and NL. Thus proper suppression of the variation in the threshold voltage of each of the transistors and improvement of the voltage characteristic of the SRAM 10 are accomplished.

In the voltage characteristic regulating process of the first and second embodiment, the voltage characteristic regulating process described above is set to be executed for all memory cells 12 of the SRAM 10. All memory cells 12 are divided into some block, and the voltage characteristic regulating process described above may be set to be executed for every block without executing for all memory cells 12 once. The voltage characteristic regulating process described above may be set to be executed for some memory cells 12.

In the voltage characteristic regulating process of the first and second embodiment, the voltage characteristic regulating process of the invention is set to be adapted to the SRAM 10. The voltage characteristic regulating process is allowed to any type of circuit including latch circuit that includes a plurality of gate circuits and input thereof is connected to output thereof. For example, as illustrated as a latch circuit 100 in FIG. 13, the voltage characteristic regulating process is adapted to the latch circuit 100 including a NOT circuit 110 and a NOR circuit 120. The NOT circuit 110 includes a p channel MOS transistor P110 and a n channel transistor N110 that are connected in series between the power-supply voltage applied node Vdd and the ground voltage applied node Vss, and inverts to output the input signal. The NOR circuit 120 includes p channel MOS transistors P120 and P122 that are connected in series between the power-supply voltage applied node Vdd and the ground voltage applied node Vss, and n channel MOS transistor N120 and N122 that are connected in series between the power-supply voltage applied node Vdd and the ground voltage applied node Vss. One of two inputs is connected to the output of the NOT circuit 110, the other is fixed to H level, output is connected to the input of the NOT circuit 110, and carrying out logical OR operation of the two inputs. In this case, the wiring connecting the input of the NOT circuit 110 to the output of the NOR circuit 120 may be removed after application of the voltage characteristic regulation process of this invention. As illustrated in the latch circuit 100B in FIG. 14, the voltage characteristic regulation process of this invention is adapted to the latch circuit that is used with gate circuits 140B and 142B and includes the NOR circuit 120 that the output thereof is input to the NOT circuit 110 via switching element SW150B that is able to be turned on and off. In this case, switching elements SW152B and SW154B that are able to be turned on and off are connected between the gate circuits 140B and 142B and the latch circuit 00B, the voltage characteristic regulation process of the first embodiment may be adapt by turning on the switching element SW150B and turning off the switching elements SW152B and SW154B. The voltage characteristic regulation process of the second embodiment may be adapted by turning on the switching elements SW150B, SW152B and SW154B. Then the latch circuit is allowed to function as a logic circuit by turning off the switching element SW150B and turning on the switching elements SW152B and SW154B. The latch circuit 100 is not restricted to include NOT circuit and NOR circuit. Any type of latch circuit that does not oscillate when input is connected to output and holds input data such as the latch circuit includes even stages connected NOT circuits that have input of the front stage NOT circuit connected to the output of the end stage NOT circuit.

Figure 4:
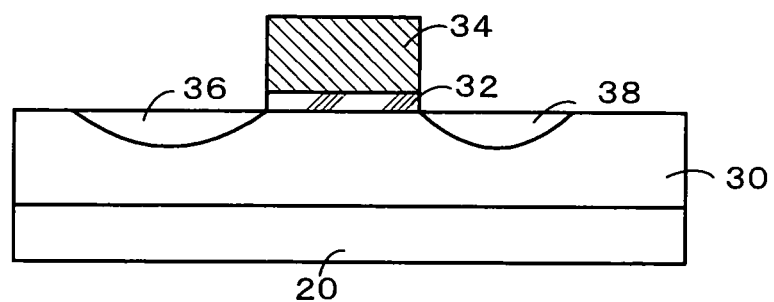
FIG. 4 schematically illustrates a construction of transistors PL and PR in section.

In the voltage characteristic regulating process of the first and second embodiment, the voltage characteristic regulating process of this invention is set to be adapted to circuit including the transistors PL, PR, NL and NR, and each of the transistors PL, PR, NL and NR is set to be constructed as illustrated in FIGS. 3 and 4. The voltage characteristic regulating process of this invention may be adapted to circuit including transistors PL and PR that are formed in n-conductivity type semiconductor substrate, and transistors NL and NR that are formed in p-conductivity well formed in the n-conductivity type semiconductor substrate.

In the voltage characteristic regulating process of the first and second embodiment, the voltage characteristic regulating process of this invention is set to be adapted to circuit including the MOS transistors, and each of the transistors is set to be constructed as illustrated in FIGS. 3 and 4. The element is not restricted to the MOS transistor that is constructed as illustrated in FIGS. 3 and 4. The voltage characteristic regulating process of this invention may be adapted to circuit including MOS transistor that has a floating gate formed on semiconductor substrate via tunnel oxide film (gate insulating film) formed from high isolation performance material, a gate formed on the floating gate via control insulating film (intergate insulating film) formed from high isolation performance material, and has adjustable threshold voltage by amount of carriers injected into the floating gate. The voltage characteristic regulating process of this invention may be adapted to circuit including MOS transistor that has a silicon quantum dot formed from fine silicon crystal instead of the floating gate, and has adjustable threshold voltage by amount of electrons injected into the silicon quantum dot. The voltage characteristic regulating process of this invention may be adapted to circuit including an insulating layer and a spin MOS field effect transistor. A source or drain of the spin MOS field effect transistor may be connected with Magnetic Tunnel Junction element. The insulating layer is formed from insulating material having relative high isolation performance such as magnesium oxide (MgO) and formed between the semiconductor substrate and gate. The insulating layer may be placed between a pinned layer and a fixed layer of the Magnetic Tunnel Junction element. The pinned layer is formed from magnetic material such as cobalt copper boron (CoFeB) so that direction of magnetization is fixed. The free layer is formed from magnetic material such as cobalt copper boron (CoFeB) so that direction of magnetization is able to vary. The voltage characteristic regulating process of this invention may be adapted to circuit including spin MOS filed effect transistor that has a source and a drain formed from ferromagnetic material such as ferric oxide (Fe2O3). The voltage characteristic regulating process of this invention may be adapted to circuit including high dielectric material gate transistor that has a high dielectric layer formed from high dielectric material such as barium titanate (BaTiO3), lead zirconate titanate (PB(Zr,Ti)O3, PZT), strontium bismuth tantalite (SrBi2Ta2O9, SBT), or bismuth lanthanum titanate ((Bi,La)4Ti3O12, BLT) between semiconductor substrate and gate.

Figure 23:
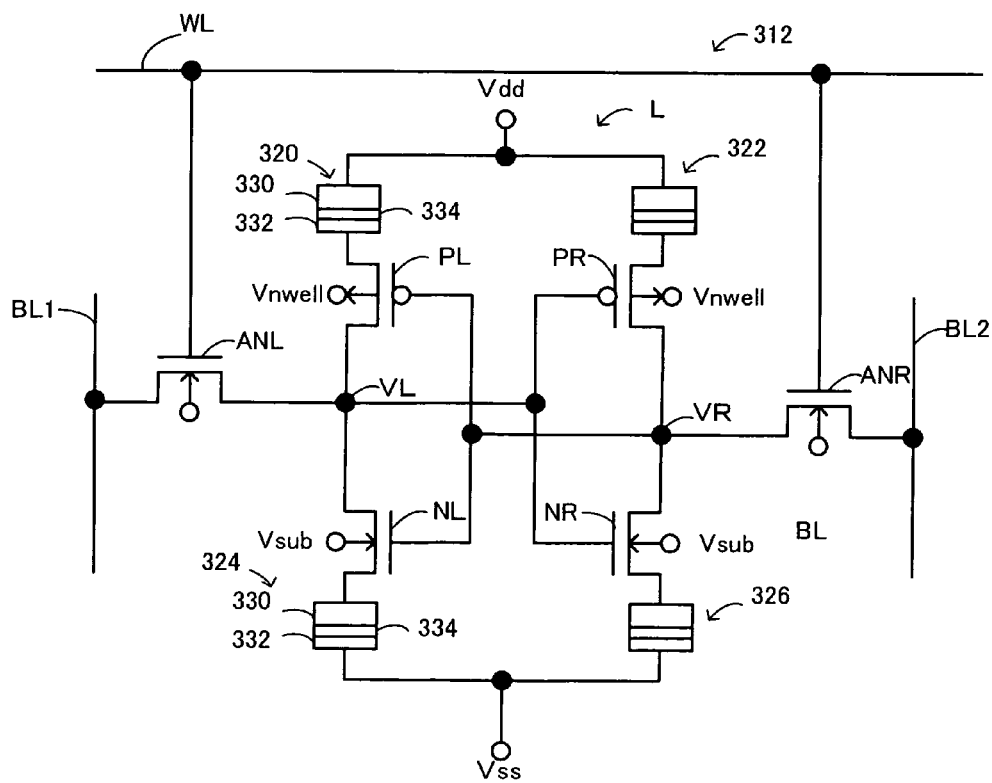
FIG. 23 schematically illustrates a circuit of the memory cell 12 of third embodiment.

Voltage characteristic regulating method of the latch circuit as third embodiment of the invention is described below. As illustrated in FIG. 23, SRAM 130 that is regulated by the voltage characteristic regulating processes of the third embodiment is the same as the SRAM 10 illustrated in FIG. 1 to FIG. 4 except for having magnetic tunnel junction elements 320, 322, 324 and 326 between source of the transistor PL and PR of the memory cell 312 and the power-supply voltage applied node Vdd or between source of the transistor NL and NR and the ground voltage applied node Vss. In FIG. 23, the same symbol as symbol in FIG. 1 to FIG. 4 is attached to the same configuration as the configuration in FIG. 1 to FIG. 4, and the same configuration as the configuration in FIG. 1 to FIG. 4 is not explained. In the voltage characteristic regulating process of the third embodiment, the same voltage as voltage in the voltage characteristic regulating process of the first embodiment illustrated in FIG. 5 is not explained.

Each of magnetic tunnel junction elements 320, 322, 324 and 326 is configured as a stacked structure including an insulating layer 334 between a pinned layer 330 and a free layer 332. The pinned layer 330 is formed from ferromagnetic material such as cobalt iron boron (CoFeB). The free layer 332 is formed from ferromagnetic material such as cobalt iron boron (CoFeB) and thinner than the pinned layer 330 in the direction of current. The insulating layer 334 is formed from insulating material having high isolation performance such as magnesium oxide (MgO). The pinned layer 330 becomes magnetized toward fixed direction regardless of direction of current between the pinned layer 330 and the free layer 332. When the current that is more than preset amount of current flows from the free layer 332 to the pinned layer 330, the direction of magnetization of the pinned layer 330 is same as that of the free layer 332 (parallel state) and resistance value is low. When the current that is more than preset amount of current flows from the pinned layer 330 to the free layer 332, the direction of magnetization of the pinned layer 330 is different from that of the free layer 332 (anti-parallel state) and resistance value is high. Each of the pinned layers 330 of the magnetic tunnel junction elements 320 and 322 is connected with the power-supply voltage applied node Vdd. Each of the free layers 332 of the magnetic tunnel junction elements 320 and 322 is connected with the source of the transistor PL or PR. Each of the pinned layers 330 of the magnetic tunnel junction elements 324 and 326 is connected with the source of the transistor NL or NR. Each of the free layers 332 of the magnetic tunnel junction elements 324 and 326 is connected with the ground voltage applied node Vss.

Voltage characteristic regulating method of the SRAM 310 during the data retention is described below. FIG. 24 schematically illustrates voltage characteristic regulating processes regulating voltage characteristic of the SRAM 10. In this processes, the magnetic tunnel junction elements 320, 322, 324 and 326 is in the parallel state when each voltage that is applied to the power-supply voltage applied node Vdd, the well 30, the word line WL or the bit lines BL1 and BL2 is range from 0V to voltage of value V2.

In the voltage characteristic regulating method of the third embodiment, the voltage is applied to each of the power-supply voltage applied node Vdd, the ground voltage applied node Vss, the semiconductor substrate 20, the well 30, the word line WL and the bit lines BL1 and BL2 of all memory cells of the RAM 310 so that voltage Vdd becomes value of V2, the ground voltage Vss and the substrate voltage Vsub become 0V, the well voltage Vnwell becomes value of V2, the word line voltage Vnwell becomes 0V, and the bit lines VBL1 and VBL2 become value of V2 (step S300). The state of each of the transistors of the memory cell 312 after executing the process of the step S300 reflects variation of current of the transistors PL, PR, NL and NR (current driving force). For illustrative purposes, each of current of the transistors PL and NR is set to be higher than that of the transistor PR or NL, the transistors PL and NR is turned on after executing of the process of the step S300, the node VL of the memory cell 12 becomes high level, and the node VR of the memory cell 12 becomes low level. In this case, the magnetic tunnel junction elements 320, 322, 324 and 326 are allowed to be in the parallel state or to have resistance in state between the parallel state and anti-parallel state.

Then, the voltage is applied to each of the power-supply voltage applied node Vdd, the ground voltage applied node Vss, the semiconductor substrate 20, the well 30, the word line WL and the bit lines BL1 and BL2 of all memory cells of the RAM 310 so that voltage Vdd becomes value of V3, the ground voltage Vss and the substrate voltage Vsub become 0V, the well voltage Vnwell becomes value of V3, the word line voltage Vw1 becomes value of V3, and the bit lines VBL1 and VBL2 become value of V3 (step S310). In this case, current flows from the bit line BL2 to the transistor NR and the magnetic tunnel junction element 326, because the node VR is set to be L level. The magnetic tunnel junction element 326 is set to be in anti-parallel state. The resistance of the magnetic tunnel junction element 326 is increased, and current flowing in the transistor NR is small. Thus the current drive force of the transistor NR is low. This has the same effect as rising of the threshold voltage of the transistor NR in the SRAM 10. This accomplishes the reduction of variation in each of the currents of the transistors NL and NR and to lower the minimum operation voltage Vmin of the SRAM 310.

After applying voltages in this way, the voltage is applied to each of the power-supply voltage applied node Vdd, the ground voltage applied node Vss, the semiconductor substrate 20, the well 30, the word line WL and the bit lines BL1 and BL2 of all memory cells of the RAM 310 so that voltage Vdd becomes value of V3, the ground voltage Vss and the substrate voltage Vsub become 0V, the well voltage Vnwell becomes value of V3, the word line voltage Vw1 becomes value of V3, and the bit lines VBL1 and VBL2 become 0V (step S32). Then the voltage characteristic regulating process is terminated. When the node VR is the L level, current flows from the power-supply voltage applied node Vdd to the bit line BL1 via the transistor PL. Current flows from the pinned layer 330 to the free layer 332 of the magnetic tunnel junction element 320, and the magnetic tunnel junction element 320 is in the anti-parallel state. This accomplishes increase of the resistance value of the magnetic tunnel junction element 320 and to reduce current flowing in the transistor PL. Thus the current drive force of the transistor NR is low. This has the same effect as rising of the threshold voltage of the transistor PR in the SRAM 10. This accomplishes reduction of variation in each of the currents of the transistors PL and PR and to lower the minimum operation voltage Vmin of the SRAM 310.

In the voltage characteristic regulating process of the third embodiment, the voltage Vdd is set to be lower than voltage applied in the normal operation. These processes allow transistor having high current of the transistors PL, PR, NL and NR included in the memory cell 312 to turn on. Then each of the voltages of the word line WL and the bit lines BL1 and BL2 are set to be voltage V higher than voltage applied in the normal operation to turn on the access transistors ANL and ANR, and voltage of value of V3 of 0V is applied to each of the bit lines BL1 and BL2. These processes accomplish to apply the current to the magnetic tunnel junction element connected to source of turn-on transistor, to set the magnetic tunnel junction element to be in the anti-parallel state to raise the resistance value and to lower the current drive force of the turn-on transistor. This accomplishes reduction of variation in each of the current drive force of the transistors PL, PR, NL and NR and improvement of the voltage characteristic of the SRAM 310.

In the voltage characteristic regulating process of the third embodiment, the process of the step S310 is set to be executed after the process of the step S300, and the process of the step S320 is set to be executed after the process of the step S310. The process of the step S310 may be executed after the process of the step S320. One of the processes of the step S310 and S320 may be executed.

Voltage characteristic regulating method of the latch circuit as fourth embodiment of the invention is described below. As illustrated in FIG. 25, SRAM 410 that is regulated by the voltage characteristic regulating processes of the third embodiment is the same as the SRAM 10 illustrated in from FIG. 1 to FIG. 4 except for having magnetic tunnel junction elements 420 and 422 respectively connected diffusion layers of the access transistors ANL and ANR on the side of the bit lines BL1 and BL2. In FIG. 25, the same symbol as in FIG. 1 to FIG. 4 is attached to the same configuration as in FIG. 1 to FIG. 4, and the same configuration as in FIG. 1 to FIG. 4 is not explained. The magnetic tunnel junction elements 420 is same configuration as the magnetic tunnel junction elements 320, 322, 324 and 326 in FIG. 5. In FIG. 25, the same symbol as in FIG. 25 is attached to the same configuration as in FIG. 5, and the same configuration as in FIG. 5 is not explained. In the voltage characteristic regulating process of the third embodiment, the same voltage as in the voltage characteristic regulating process of the first embodiment illustrated in FIG. 5 is not explained.

Each of the magnetic tunnel junction elements 420 and 422 has the pinned layer 330 connected to source, and the free layer 332 connected to the bit lines BL1 and BL2.

Figure 26:
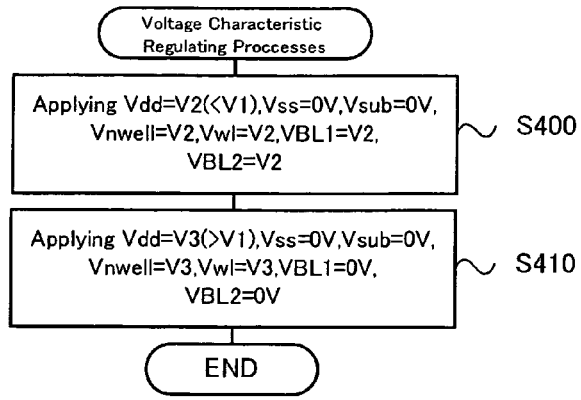
FIG. 26 schematically illustrates voltage regulating processes regulating voltage characteristic of the SRAM 10 of the fourth embodiment.

Voltage characteristic regulating method of the SRAM 410 during the data retention is described below. FIG. 26 schematically illustrates voltage characteristic regulating processes regulating voltage characteristic of the SRAM 410.

In the voltage characteristic regulating method of the fourth embodiment, voltage is applied to each of the power-supply voltage applied node Vdd, the ground voltage applied node Vss, the semiconductor substrate 20, the well 30, the word line WL and the bit lines BL1 and BL2 of all memory cells of the SRAM 410 so that voltage Vdd becomes value of V2, the ground voltage Vss and the substrate voltage Vsub become 0V, the well voltage Vnwell and the word line voltage Vw1 become value of V2, and the bit lines VBL1 and VBL2 become value of V2 (step S400). The state of each of the transistors of the memory cell 312 after executing the process of the step S400 reflects variation of current of the transistors PL, PR, NL and NR and the access transistors ANL and ANR. For illustrative purposes, each of current of the transistors NL and the access transistor ANL is set to be higher than that of the transistor NL of the access transistor ANR, the transistors NL is turned on after executing of the process of the step S400, the node VL of the memory cell 12 becomes high level, and the node VR of the memory cell 12 becomes low level.

After applying voltages in this way, the voltage is applied to each of the power-supply voltage applied node Vdd, the ground voltage applied node Vss, the semiconductor substrate 20, the well 30, the word line WL and the bit lines BL1 and BL2 of all memory cells of the RAM 410 so that the voltage Vdd becomes value of V3, the ground voltage Vss and the substrate voltage Vsub become 0V, the well voltage Vnwell becomes value of V3, the word line voltage Vw1 becomes value of V3, and the bit lines VBL1 and VBL2 become 0V (step S410). Then the voltage characteristic regulating process is terminated. When the node VL is the H level, current flows in the direction from the pinned layer 330 to the free layer 320 of the magnetic tunnel junction element 420, and the magnetic tunnel junction element 420 is in the anti-parallel state. This accomplishes increase of the resistance value of the magnetic tunnel junction element 320. Thus the current drive force of the access transistor ANL is low. This has the same effect as rising of the threshold voltage of the access transistor ANL in the SRAM 10. This accomplishes reduction of variation in each of the currents of the transistors and to lower the minimum operation voltage Vmin of the SRAM 310.

In the voltage characteristic regulating process of the fourth embodiment, the voltage Vdd is set to be lower than voltage applied in the normal operation. These processes allow transistor having high current of the transistors PL, PR, NL and NR and the access transistor ANL and ANR included in the memory cell 412 to turn on. Then each of the voltages of the power-supply voltage applied node Vdd and the word line WL are set to be voltage V higher than voltage applied in the normal operation to turn on the access transistors ANL and ANR, and voltage of 0V is applied to each of the bit lines BL1 and BL2. These processes accomplish to set the magnetic tunnel junction element that is connected to node of H level of the node VL and VR to be in the anti-parallel state, to raise the resistance value, and to lower the current This accomplishes reduction of variation in each of the current of each transistors and improvement of the voltage characteristic of the SRAM 410.

Threshold voltage regulating method of insulated gate type transistor 512 included in logic circuit 510 as one embodiment of the invention is described below. Plurality of the insulated gate type transistors 512 is included in the logic circuit. The insulated gate type transistors 512 are configured to be same as the n-channel MOS transistor illustrated in FIG. 3. In the configuration of the insulated gate type transistor, the same symbol as the n-channel MOS transistor in FIG. 3 is attached to the same configuration, and detailed configuration of the insulated gate type transistor is not explained. In the normal operation, for the insulated gate type transistor 512, voltage of value of V6 (for example, 1.0V) is applied as gate voltage Vg, voltage of value of V1 is applied as drain voltage Vd, voltage of 0V is applied as source voltage Vs, and voltage of 0V is applied as substrate voltage Vsub.

Figure 27:
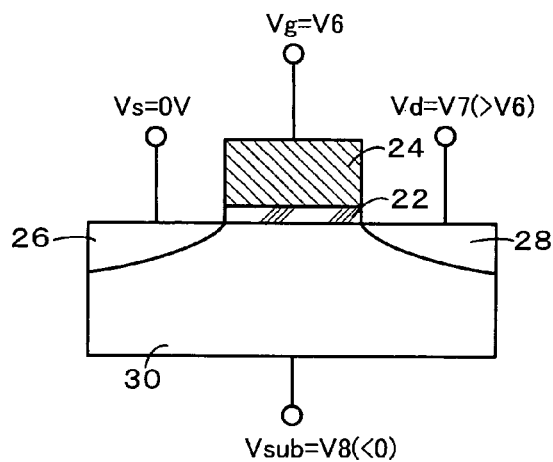
FIG. 27 schematically illustrates a voltage condition in the transistor.
Figure 28:
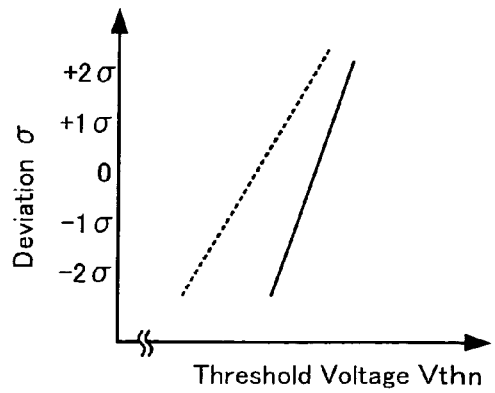
FIG. 28 schematically illustrates variation in the threshold voltage of a plurality of gate type transistors 112 applied threshold voltage regulating method of the embodiment.

The threshold voltage regulating method of the insulated gate type transistor 512 is described below. In the threshold voltage regulating method of this embodiment, as illustrated in FIG. 27, voltages are collectively applied to the gate 24, the source 26, the drain 28 and the semiconductor substrate 20 so that the gate voltage Vg becomes value of V6, the drain voltage Vd becomes value of V7 (for example, 2.5V), the source voltage Vs becomes 0V, and the substrate voltage Vsub becomes value of V8 (for example, −5V). The value of V7 is set to be preset voltage that is set by experiment or analysis, and is able to inject hot carrier having high energy of electron-hole pairs into the insulating layer 22. The electron-hole pairs are generated by impact ionization when electrons flowing from the source 26 by Drain Avalanche Hot Carrier (DAHC) are accelerated by high electric field close to the drain 28, and the high energy electrons collide with atomic silicon in the substrate 20. For example, voltage difference between the drain 28 and the source 26 is set to be about as twice as voltage difference between the gate 24 and the source 26. FIG. 28 schematically illustrates variation in the threshold voltage of a plurality of gate type transistors 212 applied threshold voltage regulating method of the embodiment. In FIG. 28, dashed line indicates the variation in threshold voltage before executing the threshold voltage regulating method of the embodiment. Solid line indicates the variation in threshold voltage after executing the threshold voltage regulating method of the embodiment. In the FIG. 28, horizontal axis indicates the threshold voltage. Longitudinal axis indicates, as same as FIG. 9, dispersion a from mean value Vthnav of the threshold voltage assuming that relation between the threshold voltage and number of the transistors NR is normal distribution curve. As illustrated in FIG. 28, the threshold voltage after executing the threshold voltage regulating method of this embodiment is higher than before executing the threshold voltage regulating method. The steeper the slope is, the less the variation of the threshold voltage is. The reduction of the variation in the threshold voltage of the gate insulated type transistor 212 is accomplished just by regulating the gate voltage Vg, the drain voltage Vd, the source voltage Vs and the substrate voltage Vsub. This accomplishes improvement of the variation in the threshold voltage of the gate insulated type transistor 212 by simpler method.

In the threshold voltage regulating method described above, the voltage applied to the drain 28 is adjusted so that the voltage difference between the drain 28 and the source 26 of the gate insulated type transistor 512 is set to be higher than the voltage difference between the gate 24 and the source 26 of the gate insulated type transistor 512, and is set to be equal to or higher than in the normal operation of the gate insulated type transistor 512. The threshold voltage of the plurality of transistors 512 is collectively adjusted. This accomplishes adjustment the threshold voltage of the plurality of transistors 512 collectively.

In the threshold voltage regulating method of this embodiment, the substrate voltage Vsub is set to be value of V8. The substrate voltage Vsub may be set to be voltage (for example, 0V) in the normal operation of the insulated gate type transistor 512.

In the threshold voltage regulating method of this embodiment, the voltage difference between the drain 28 and the source 26 of the gate insulated type transistor 512 is set to be higher than the voltage difference between the gate 24 and the source 26 of the gate insulated type transistor 512, and is set to be equal to or higher than in the normal operation of the gate insulated type transistor 512. All the voltage difference between the drain 28 and the source 26 has to do is being higher than the voltage difference between the gate 24 and the source 26. The gate voltage Vg may be set to be lower than voltage applied to the gate in the normal operation. Both the gate voltage Vg and the drain voltage Vd may be adjusted.

In the this embodiment, the threshold voltage regulating method of this invention is set to be adapted to the logic circuit having a plurality of n channel MOS transistors illustrated FIG. 3. The threshold voltage regulating method is allowed to be adapted any type of logic circuit having an insulated gate type transistor that includes an insulating layer between a gate and a substrate. The threshold voltage regulating method of this invention may be set to be adapted to the logic circuit having a plurality of p channel MOS transistors illustrated FIG. 4. In this case, any one of voltage applied to the drain 38 and voltage applied to the gate 34 may be adjusted so that the voltage difference between the drain 38 and the source 36 is higher than the voltage difference between the gate 34 and the source 36, and is equal to or higher than voltage difference raising the threshold voltage of the p channel MOS transistor (the insulated gate type transistor). For example, the gate voltage Vg is set to be 0V, the source voltage Vs is set to be value of V1, the drain voltage Vd is set to be value of V9 (for example, −2.5V) and the well voltage Vnwell is set to be value of V10 (for example, 5V). Application of the threshold voltage regulating method is not restricted to the circuit described above. The threshold voltage regulating method may be adapted to a circuit different from logic circuit such as a memory circuit, that is, DRAM (Dynamic Random Access Memory).

Figure 29:
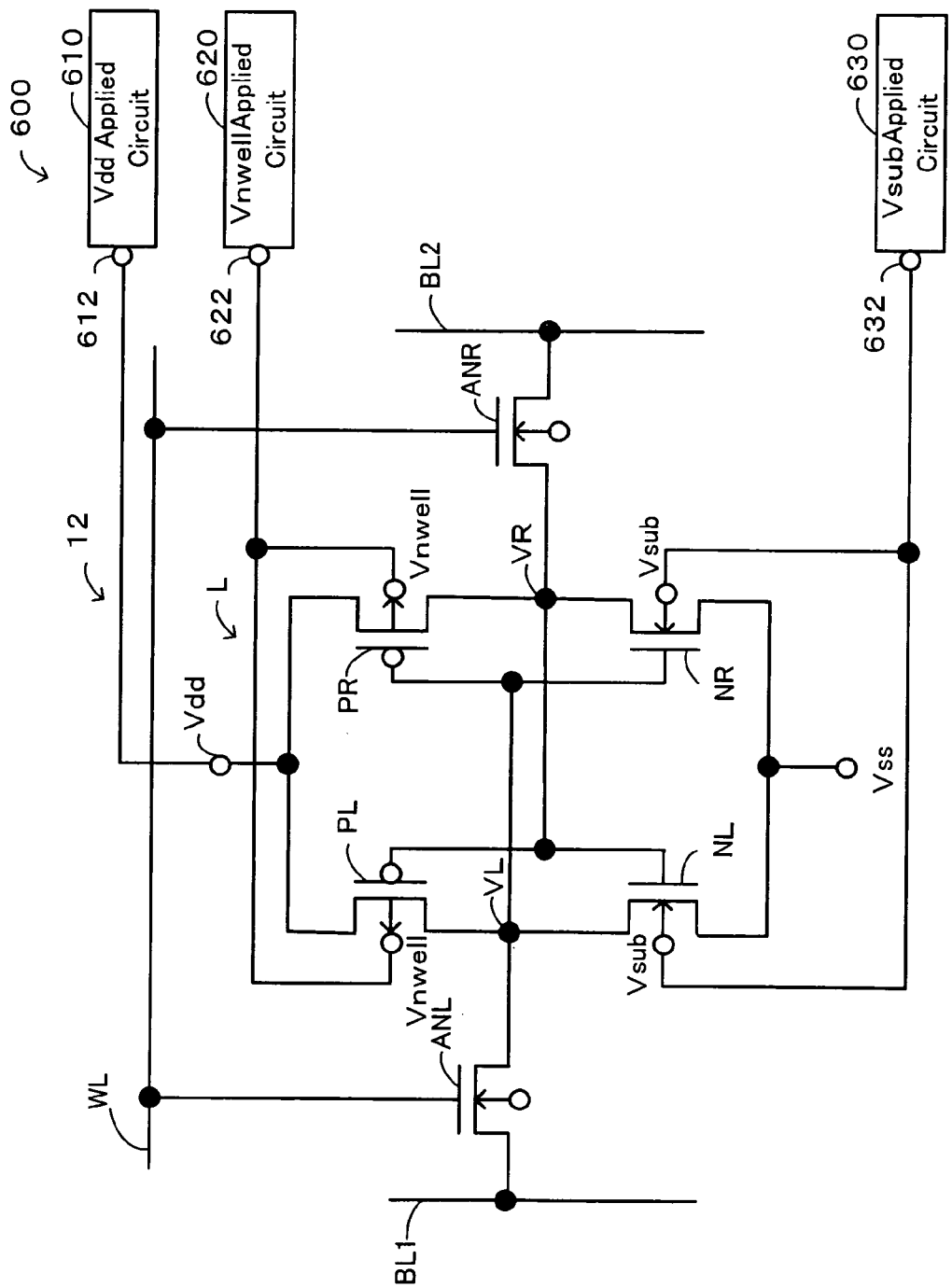
FIG. 29 schematically illustrates configuration of a voltage characteristic regulator 600 regulating voltage characteristic of the memory cell 12 of the SRAM 10 of one embodiment of the invention.
Figure 30:
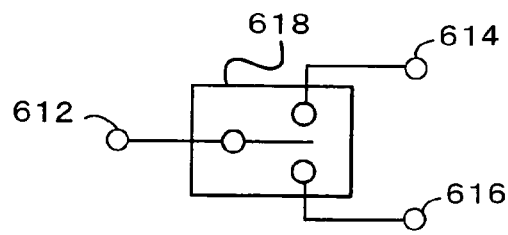
FIG. 30 schematically illustrates configuration of a Vdd applying circuit 610 of the voltage characteristic regulator 600.
Figure 31:
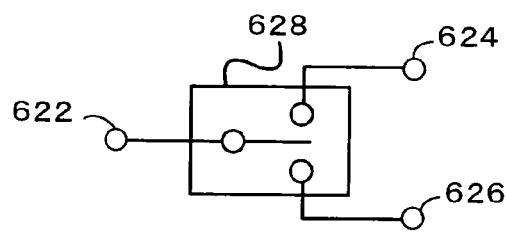
FIG. 31 schematically illustrates configuration of a Vnwell applying circuit 620 of the voltage characteristic regulator 600.
Figure 32:
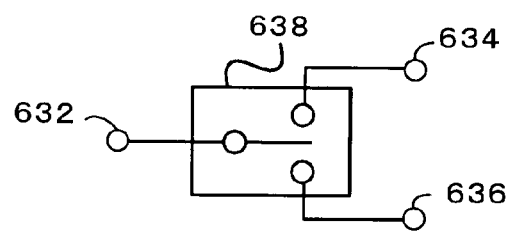
FIG. 32 schematically illustrates configuration of a Vsub applying circuit 630 of the voltage characteristic regulator 600.

FIG. 29 schematically illustrates configuration of a voltage characteristic regulator 600 regulating voltage characteristic of the memory cell 12 of the SRAM 10 of one embodiment of the invention. FIG. 30 schematically illustrates configuration of a Vdd applying circuit 610 of the voltage characteristic regulator 600. FIG. 31 schematically illustrates configuration of a Vnwell applying circuit 620 of the voltage characteristic regulator 600. FIG. 32 schematically illustrates configuration of a Vsub applying circuit 630 of the voltage characteristic regulator 600. As illustrated in FIG. 29, the voltage characteristic regulator 600 has Vdd applied circuit 610 including output terminal 612 that is connected to the power-supply node Vdd of the memory cell 12 and applying voltage Vdd to the power-supply voltage applied node Vdd, a Vnwell applied circuit 620 including output terminal 622 that is connected to the well 30 of the memory cell 12 and applying the well voltage Vnwell to the well 30, and a Vsub applied circuit 630 including output terminal 632 that is connected to the semiconductor substrate 20 and applying the substrate voltage Vsub to the semiconductor substrate 20.

As illustrated in FIG. 30, the Vdd applied circuit 610 has a switch 618 switching connecting point of the output terminal 612 to a voltage terminal 614 or a voltage terminal 616. Voltage of value V1 (for example, 1.2V) applied to the power-supply voltage applied node Vdd in the normal operation of the SRAM 10 or voltage value of V2 (for example, 0.3V) lower than value of V1 is applied to the voltage terminal 614. Voltage value of V3 (for example, 3.5V) higher than value of V1 is applied to the voltage terminal 616. Thus the switch 618 switches between the voltage terminal 616 and the output terminal 612. The voltage terminal 616 is connected to the power-supply voltage applied node Vdd of the memory cell 12 of the SRAM 10, and is not connected to another circuit of the SRAM 10 except for the memory cell 12 such as the row decoder 14 of the column decoder 16. This accomplishes adjustment of voltage characteristic of the only memory cell 10 without adjustment of another circuit except for the memory cell 10.

As illustrated in FIG. 31, the Vnwell applied circuit 620 has a switch 628 switching connecting point of the output terminal 622 to a voltage terminal 624 or a voltage terminal 626. Voltage of value V1 (for example, 1.2V) applied to the power-supply voltage applied node Vdd in the normal operation of the SRAM 10 or voltage value of V2 (for example, 0.3V) lower than value of V1 is applied to the voltage terminal 614. Voltage value of V3 (for example, 3.5V) higher than value of V1 or voltage value of V5 (for example, 9.5V) higher than value of V3 is applied to the voltage terminal 626. Thus the switch 628 switches between the voltage terminal 626 and the output terminal 622. The voltage terminal 626 is connected to the well 30 of the memory cell 12 of the SRAM 10, and is not connected to well of another circuit of the SRAM 10 except for the memory cell 12. This accomplishes adjustment of voltage characteristic of the only memory cell 10 without adjustment of another circuit except for the memory cell 10.

As illustrated in FIG. 32, the Vsub applied circuit 630 has a switch 638 switching connecting point of the output terminal 632 to a voltage terminal 634 applied voltage of 0V thereto or a voltage terminal 636 applied voltage of negative value of V4 (for example, −6V) thereto. Thus the switch 638 switches between the voltage terminal 636 and the output terminal 632. The voltage terminal 636 is connected to the semiconductor substrate 20 of the memory cell 12 of the SRAM 10, and is not connected to the semiconductor substrate 20 of another circuit except for the memory cell 12 when the semiconductor substrate 20 of the memory cell 12 of the SRAM 10 is isolated from semiconductor substrate of another circuit except for the memory cell 12 of the SRAM 10. This accomplishes adjustment of voltage characteristic of the only memory cell 10 without adjustment of another circuit except for the memory cell 10.

The voltage characteristic regulator 600 configured above has the Vdd applied circuit 610, the Vnwell applied circuit 620 and the Vsub applied circuit 630. The switch 618 of the Vdd applied circuit 610, the switch 628 of the Vnwell applied circuit 620 and the switch 638 of the Vsub applied circuit 630 are switched by switch control circuit not illustrated, and voltages of the output terminals 612, 622 and 632 are adjusted so that the voltage characteristic regulating processes illustrated in FIG. 5 is executed. This accomplishes improvement of the voltage characteristic of the memory cell 12 by simpler method. That is, the voltages of 0V is applied to the word line WL to turn off the access transistors ANL and ANR, and the voltage Vdd is set to be lower than voltage applied in the normal operation. These processes allow transistor having low threshold voltage of the transistors PL, PR, NL and NR included in the memory cell 12 to turn on. Then voltage is applied to each of the power-supply voltage applied node Vdd, the ground voltage applied node Vss, the semiconductor substrate 20 and the well 30 so that relative high voltage that raises the threshold voltage of the turn-on transistor are applied between the gate 24 of turn-on transistor and the semiconductor substrate 20 or between the gate 30 and well 30. This process accomplishes rising of the threshold voltage of the transistor that is turned on, the reduction of the variation in the threshold voltage between the transistors PL, PR NR and NL of the memory cell 12, the improvement of the voltage characteristic of the memory cell 12 in the data retention. The reduction of the variation in the threshold voltage is accomplished just by adjusting voltages applied to the power-supply voltage applied node Vdd, the ground voltage applied node Vss, the semiconductor substrate 20 and the well 30. This accomplishes the improvement of the voltage characteristic of the memory cell 12 by simpler method. Voltages that is different in the normal operation is applied to the power-supply voltage applied node Vdd, the ground voltage applied node Vss, the well 30 and the semiconductor substrate 20, and is not applied to another circuit. This accomplishes adjustment of voltage characteristic of the only memory cell 12.

In the voltage characteristic regulator 600 of this embodiment described above, the voltages of 0V is applied to the word line WL of the memory cell 12 to turn off the access transistors ANL and ANR, and the voltage Vdd is set to be lower than voltage applied in the normal operation. These processes allow transistor having low threshold voltage of the transistors PL, PR, NL and NR included in the memory cell 12 to turn on. Then voltage is applied to each of the power-supply voltage applied node Vdd, the ground voltage applied node Vss, the semiconductor substrate 20 and the well 30 so that relative high voltage that raises the threshold voltage of the turn-on transistor are applied between the gate 24 of turn-on transistor and the semiconductor substrate 20 or between the gate 30 and well 30. This process accomplishes rising of the threshold voltage of the transistor that is turned on, the reduction of the variation in the threshold voltage between the transistors PL, PR NR and NL of the memory cell 12, the improvement of the voltage characteristic of the memory cell 12 in the data retention. The reduction of the variation in the threshold voltage is accomplished just by adjusting voltages applied to the power-supply voltage applied node Vdd, the ground voltage applied node Vss, the semiconductor substrate 20 and the well 30. This accomplishes the improvement of the voltage characteristic of the memory cell 12 by simpler method. Voltages that is different in the normal operation is applied to the power-supply voltage applied node Vdd, the ground voltage applied node Vss, the well 30 and the semiconductor substrate 20, and is not applied to another circuit. This accomplishes adjustment of voltage characteristic of the only memory cell 12.

Figure 33:
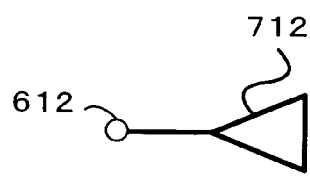
FIG. 33 schematically illustrates configuration of a Vdd applying circuit 710 of modified embodiment.

In the voltage characteristic regulator 600 of this embodiment, the output terminal 612 of the Vdd applied circuit 610 is set to be connected to the output terminal 614 or 616 by the switch 618. As illustrated in FIG. 33 as a Vdd applying circuit 710 of modified embodiment, the output terminal 612 may be connected to the variable voltage generating circuit 710 that is able to generate voltage of value of V1, V2 and V3.

Figure 34:
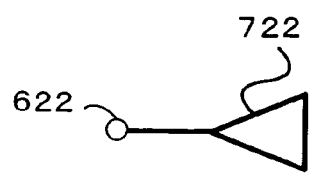
FIG. 34 schematically illustrates configuration of a Vnwell applying circuit 720 of the modified embodiment.

In the voltage characteristic regulator 600 of this embodiment, the output terminal 622 of the Vnwell applied circuit 620 is set to be connected to the output terminal 624 or 626 by the switch 628. As illustrated in FIG. 34 as a Vdd applying circuit 720 of modified embodiment, the output terminal 622 may be connected to the variable voltage generating circuit 720 that is able to generate voltage of value of V1, V2 and V3.

Figure 35:
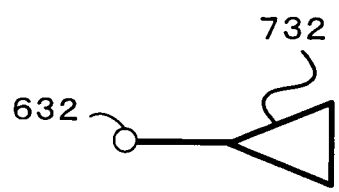
FIG. 35 schematically illustrates configuration of a Vsub applying circuit 730 of the modified embodiment.

In the voltage characteristic regulator 600 of this embodiment, the output terminal 632 of the Vsub applied circuit 630 is set to be connected to the output terminal 634 or 636 by the switch 638. As illustrated in FIG. 35 as a Vdd applying circuit 730 of modified embodiment, the output terminal 632 may be connected to the variable voltage generating circuit 730 that is able to generate voltage of 0V or value of V4.

In the voltage characteristic regulator 600 of this embodiment, the switch 618 of the Vdd applied circuit 610, the switch 628 of the Vnwell applied circuit 620 and the switch 638 of the Vsub applied circuit 630 are switched, and voltages of the output terminals 612, 622 and 632 are set to be adjusted so that the voltage characteristic regulating processes illustrated in FIG. 5 is executed. The switch 618, 628 and 638 may be switched and voltages of the output terminals 612, 622 and 632 may be set to be adjusted so that the voltage characteristic regulating processes illustrated in FIG. 13 instead of FIG. 5 is executed.

The embodiment discussed above is to be considered in all aspects as illustrative and no restrictive. There may be many modifications, changes, and alternative without departing from the scope or spirit of the main characteristics of the present invention.

Industrial Applicability

The technique of the present invention is preferably applied to the latch circuit, the semiconductor device, the insulated gate type transistor and the voltage characteristic regulator.

The invention claimed is:

1. A voltage characteristic regulating method for regulating voltage characteristics of a latch circuit, the latch circuit comprising two nodes for retaining data of the latch circuit and a plurality of gate type transistors that are formed in a semiconductor substrate, the voltage characteristic regulating method comprising:

applying a preset low voltage to a power-supply voltage applied node that a power-supply voltage is applied thereto in normal operation of the latch circuit; and then applying a voltage that is higher than the power-supply voltage in the normal operation of the latch circuit and is able to nonvolatilely raise a threshold voltage of at least one of the gate type transistors to the power-supply voltage applied node, the preset low voltage being lower than the power-supply voltage in the normal operation of the latch circuit and the preset low voltage being such that each level of the two nodes is fixed and not able to be inverted.

2. The voltage characteristic regulating method in accordance with claim 1, wherein in normal operation of the latch circuit, a normal operation substrate voltage applied to the semiconductor substrate, and then at least one of the preset low voltage and the normal operation substrate voltage is adjusted so that an adjusted voltage difference between the power-supply voltage applied node and the semiconductor substrate is equal to or higher than a preset voltage difference that is larger than an unadjusted voltage difference between the power-supply voltage applied node and the semiconductor substrate in the normal operation of the latch circuit.

3. The voltage characteristic regulating method in accordance with claim 1, wherein the latch circuit comprises a plurality of n-conductivity gate type transistors formed in a p-conductivity semiconductor substrate, and a plurality of p-conductivity gate type transistors formed in an n-conductivity well region that is formed in the semiconductor substrate, a normal operatiom substrate voltage applied to the semiconductor substrate, a normal well voltage applied to the well region in the normal operation of the latch circuit is applied to the well region, and then a preset high voltage that is higher than power-supply voltage in the normal operation of the latch circuit is applied to the power-supply voltage applied node of the latch circuit, and the preset high voltage is applied to the well region and voltage that is lower than the normal operation substrate voltage is applied to the semiconductor substrate so that an adjusted voltage difference between the power-supply voltage applied node and the semiconductor substrate is equal to or higher than a preset n-conductivity transistor voltage difference that is larger than an unadjusted voltage difference between the power-supply voltage applied node and the semiconductor substrate in the normal operation of the latch circuit.

4. The voltage characteristic regulating method in accordance with claim 1, wherein the latch circuit comprises a plurality of n-conductivity gate type transistors formed in a p-conductivity semiconductor substrate, and a plurality of p-conductivity gate type transistors formed in an n-conductivity well region that is formed in the semiconductor substrate, a normal operation substrate voltage is applied to the semiconductor substrate, a normal well voltage applied to the well region in the normal operation of the latch circuit is applied to the well region, and then a preset high voltage that is higher than power-supply voltage in the normal operation of the latch circuit is applied to the power-supply voltage applied node of the latch circuit, the normal operation substrate voltage is applied to the semiconductor substrate and a voltage that is higher than the normal operation well voltage is applied to the well region so that an adjusted voltage difference between the power-supply voltage applied node and the well region is equal to or higher than a preset p-conductivity transistor voltage difference that is larger than an unadjusted voltage difference between the power-supply voltage applied node and the well region in the normal operation of the latch circuit.

5. A voltage characteristic regulating method for regulating voltage characteristics of a plurality of latch circuits, each of the latch circuits comprising two nodes for retaining data, and a plurality of gate type transistors that are formed in a semiconductor substrate, the voltage characteristic regulating method comprising:
applying a preset low voltage to power-supply voltage applied nodes of each of the latch circuits, each of the power-supply voltage applied nodes being applied a power-supply voltage thereto in normal operation of the plurality of latch circuits; and then
applying a voltage that is higher than the power-supply voltage in the normal operation of the latch circuits and is able to nonvolatilely raise a threshold voltage of at least one of the gate type transistors of each of the latch circuits to each of the power-supply voltage applied nodes,
the preset low voltage being lower than the power-supply voltage in the normal operation of the latch circuits and the preset low voltage being such that, in each of the latch circuits, each level of the two nodes is fixed and not able to be inverted.

6. The voltage characteristic regulating method in accordance with claim 5, wherein in normal operation of each of the latch circuits,
a normal operation substrate voltage is applied to the semiconductor substrate, and then
at least one of the preset low voltage and the normal operation substrate voltage is adjusted so that an adjusted voltage difference between the power-supply voltage applied node and the semiconductor substrate is equal to or higher than a preset voltage difference that is larger than an unadjusted voltage difference between the power-supply voltage applied node and the semiconductor substrate in the normal operation of the latch circuit.

7. A voltage characteristic regulating method for regulating voltage characteristics of a semiconductor device, the semiconductor device comprising:
a first transistor being a p-conductivity gate type transistor and having a source connected with a power-supply voltage applied node that a power-supply voltage is applied thereto in the normal operation;
a second transistor being a n-conductivity gate type transistor having a drain connected with a drain of the first transistor, a gate connected with a gate of the first transistor, and a source connected with a ground voltage applied node that is applied a ground voltage thereto in the normal operation;
a third transistor being a p-conductivity gate type transistor having a source connected with the power-supply voltage applied node, a gate connected with a connecting node that is connected with the drain of the first transistor and the drain of the second transistor, and a drain connected with a connecting node that is connected with the gate of the first transistor and the gate of the second transistor;
a fourth transistor being an n-conductivity gate type transistor having a drain connected with the drain of the third transistor, a gate connected with the gate of the third transistor and a source connected with the ground voltage applied node;
a first access transistor being an n-conductivity gate type transistor having a gate connected with a word line that is applied a control voltage thereto in the normal operation, electrically connecting a connecting node that is connected with the drain of the first transistor and the drain of the second transistor with a first bit line that outputs data in turning on, and electrically disconnecting the connecting node that is connected with the drain of the first transistor and the drain of the second transistor with the first bit line in turning off; and
a second access transistor being an n-conductivity gate type transistor having a gate connected with the word line, electrically connecting a connecting node that is connected with the drain of the third transistor and the drain of the fourth transistor with the second bit line that outputs data and differs from the first bit line in turning on, and electrically disconnecting the connecting node that is connected with the drain of the third transistor and the drain of the fourth transistor with the second bit line in turning off,
each of the first transistor, the second transistor, the third transistor, the fourth transistor, the first access transistor, and the second access transistor being formed in a semiconductor substrate respectively,
the voltage characteristic regulating method comprising:
applying a preset low voltage to the power-supply voltage applied node in the normal operation of the semiconductor device, the preset low voltage being lower than the power-supply voltage in the normal operation of the semiconductor device and the preset low voltage being such that each level of the two nodes is fixed and not able to be inverted;
applying a voltage that is higher than the power-supply voltage in the normal operation of the semiconductor device and is able to nonvolatilely raise a threshold voltage of at least one of the first transistor, the second transistor, the third transistor, the fourth transistor, the first access transistor, and the second access transistor to the power-supply voltage applied node;
applying a normal operation substrate voltage applied in the normal operation of the semiconductor device to the semiconductor substrate; and then
adjusting at least one of the preset low voltage and the normal operation substrate voltage so that an adjusted voltage difference between the power-supply voltage applied node and the semiconductor substrate is equal to or higher than a preset voltage difference that is larger than an unadjusted voltage difference between the power-supply voltage applied node and the semiconductor substrate in the normal operation of the semiconductor device.

8. The voltage characteristic regulating method in accordance with claim 7, wherein
each of the first transistor and the third transistor comprises a stacked structure, the stacked structure comprising an insulating layer between a pinned layer and a free layer, the pinned layer formed from first magnetic material, formed so that direction of magnetization is fixed, and connected with a source of one of the first transistor and the third transistor connected with the structure, the free layer formed from second magnetic material, formed so that direction of magnetization is able to vary, and connected with the power-supply voltage applied node, and the insulating layer formed from insulating material having preset isolation performance, and
each of the second transistor and the fourth transistor comprises a stacked structure, the stacked structure comprising an insulating layer between a pinned layer and a free layer, the pinned layer formed from first magnetic material, formed so that direction of magnetization is fixed, and connected with a drain of one of the first transistor and the third transistor connected with the structure, the free layer formed from second magnetic material, formed so that direction of magnetization is able to vary , and connected with the ground voltage applied node, and the insulating layer formed from insulating material having preset isolation performance.

9. The voltage characteristic regulating method in accordance with claim 8, wherein the control voltage is adjusted so that a voltage difference between the word line and the ground voltage applied node becomes a voltage difference that turns off the first and second transistors, the preset low voltage is applied to the power-source voltage applied node, the normal operation substrate voltage is applied to the semiconductor substrate, and voltages applied to the first bit line, the second bit line, and the ground voltage applied node are adjusted so that voltage differences between the first bit line, the second bit line, and the ground voltage applied node become equal to a normal bit voltage that is applied to the first bit line, the second bit line, and the ground voltage applied node in the normal operation of the semiconductor device, and then the control voltage is adjusted so that the voltage difference between the word line and the ground voltage applied node becomes higher than a voltage difference that turns on the first and second transistors, at least one of the preset low voltage and the normal operation substrate voltage is adjusted so that the adjusted voltage difference between the power-supply voltage applied node and the semiconductor substrate becomes equal to or higher than the preset voltage difference, and the voltages applied to the first bit line, the second bit line, and the ground voltage applied node are adjusted so that the voltage differences between the first bit line, the second bit line and the ground voltage applied node become higher than the normal bit voltage.

10. The voltage characteristic regulating method in accordance with claim 8, wherein the control voltage is adjusted so that a voltage difference between the word line and the ground voltage applied node becomes a voltage difference that turns off the first and second transistors, the preset low voltage is applied to the power-source voltage applied node, the normal operation substrate voltage is applied to the semiconductor substrate, and voltages applied to the first bit line, the second bit line, and the ground voltage applied node are adjusted so that voltage differences between the first bit line, the second bit line, and the ground voltage applied node become equal to a normal bit voltage that is applied to the first bit line, the second bit line and the ground voltage applied node in the normal operation of the semiconductor device, and then the control voltage is adjusted so that the voltage difference between the word line and the ground voltage applied node becomes higher that a voltage difference that turns on the first and second transistors, at least one of the preset low voltage and the normal operation substrate voltage is adjusted so that the adjusted voltage difference between the power-supply voltage applied node and the semiconductor substrate becomes equal to or higher than the preset voltage difference, and the voltages applied to the first bit line, the second bit line, and the ground voltage applied node are adjusted so that the voltage differences between the first bit line, the second bit line, and the ground voltage applied node become zero.

11. The voltage characteristic regulating method in accordance with claim 7, wherein the first transistor is connected with the first bit line via a stacked structure, the stacked structure comprising an insulating layer between a pinned layer and a free layer, the pinned layer formed from first magnetic material, formed so that direction of magnetization is fixed, and connected with a source of one of the first transistor and the third transistor connected with the structure, the free layer formed from second magnetic material, formed so that direction of magnetization is able to vary, and connected with the power-supply voltage applied node, and the insulating layer formed from insulating material having preset isolation performance, and the second transistor is connected with the second bit line via a stacked structure, the stacked structure comprising an insulating layer between a pinned layer and a free layer, the pinned layer formed from first magnetic material, formed so that direction of magnetization is fixed, and connected with a drain of one of the first transistor and the third transistor connected with the structure, the free layer formed from second magnetic material, formed so that direction of magnetization is able to vary and connected with the ground voltage applied node, and the insulating layer formed from insulating material having preset isolation performance.

12. The voltage characteristic regulating method in accordance with claim 11, wherein the control voltage is adjusted so that a voltage difference between the word line and the ground voltage applied node becomes a voltage difference that turns on the first and second transistors, the preset low voltage is applied to the power-source voltage applied node, the normal operation substrate voltage is applied to the semiconductor substrate, and voltages applied to the first bit line, the second bit line and the ground voltage applied node are adjusted so that voltage differences between the first bit line, the second bit line and the ground voltage applied node become equal to a normal bit voltage that is applied to the first bit line, the second bit line and the ground voltage applied node in the normal operation of the semiconductor device, and then the control voltage is adjusted so that the voltage difference between the word line and the ground voltage applied node becomes higher than a voltage difference that turns on the first and second transistors, at least one of the preset low voltage and the normal operation substrate voltage is adjusted so that the adjusted voltage difference between the power-supply voltage applied node and the semiconductor substrate becomes equal to or higher than the preset voltage difference, and the voltages applied to the first bit line, the second bit line, and the ground voltage applied node are adjusted so that the voltage differences between the first bit line, the second bit line and the ground voltage applied node become zero.

13. A voltage characteristic regulating apparatus for regulating voltage characteristics of a latch circuit, the latch circuit comprising two nodes for retaining data of the latch circuit and a plurality of gate type transistors that are formed in a semiconductor substrate, the voltage characteristic regulating apparatus comprising:

a voltage applying circuit that applies a preset low voltage to a power-supply voltage applied node that a power-supply voltage is applied thereto in normal operation of the latch circuit, the voltage applying circuit applies a second voltage that is higher than the power-supply voltage in the normal operation of the latch circuit, the second voltage being able to nonvolatilely raise a threshold voltage of at least one of the gate type transistors to the power-supply voltage applied node, the preset low voltage being lower than the power-supply voltage in the normal operation of the latch circuit and the preset low voltage being such that each level of the two nodes is fixed and not able to be inverted.

14. The voltage characteristic regulating apparatus in accordance with claim 13, wherein the voltage applying circuit comprises one of a change over switch and a variable voltage generating circuit, the change over switch switching between applying the preset low voltage to the power-supply voltage applied node and applying the second voltage to the power-supply voltage applied node at least, the variable voltage generating circuit being able to generate the preset low voltage and the second voltage at least.

15. The voltage characteristic regulating apparatus in accordance with claim 13, wherein in normal operation of the latch circuit, the voltage applying circuit applies normal operation substrate voltage that is applied in the normal operation to the semiconductor substrate, and adjusts at least one of the preset low voltage and the normal operation substrate voltage so that an adjusted voltage difference between the power-supply voltage applied node and the semiconductor substrate is equal to or higher than a preset voltage difference that is larger than an unadjusted voltage difference between the power-supply voltage applied node and the semiconductor substrate in the normal operation of the latch circuit.

* * * * *